US009642259B2

(12) United States Patent
Kim et al.

(10) Patent No.: US 9,642,259 B2
(45) Date of Patent: May 2, 2017

(54) EMBEDDED BRIDGE STRUCTURE IN A SUBSTRATE

(71) Applicant: QUALCOMM Incorporated, San Diego, CA (US)

(72) Inventors: Chin-Kwan Kim, San Diego, CA (US); Omar James Bchir, San Marcos, CA (US); Dong Wook Kim, San Diego, CA (US); Hong Bok We, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 563 days.

(21) Appl. No.: 14/067,677

(22) Filed: Oct. 30, 2013

(65) Prior Publication Data

US 2015/0116965 A1    Apr. 30, 2015

(51) Int. Cl.
*H05K 7/10* (2006.01)
*H05K 7/12* (2006.01)
*H05K 1/18* (2006.01)
*H05K 1/11* (2006.01)
*H01L 23/538* (2006.01)
*H01L 25/065* (2006.01)
*H01L 23/00* (2006.01)

(52) U.S. Cl.
CPC .......... *H05K 1/18* (2013.01); *H01L 23/5383* (2013.01); *H01L 23/5385* (2013.01); *H01L 25/0655* (2013.01); *H05K 1/11* (2013.01); *H01L 24/13* (2013.01); *H01L 24/16* (2013.01); *H01L 2224/131* (2013.01); *H01L 2224/16225* (2013.01); *H01L 2924/15192* (2013.01); *H01L 2924/15313* (2013.01)

(58) Field of Classification Search
USPC ................................ 361/767, 752, 808, 768
See application file for complete search history.

(56) References Cited

U.S. PATENT DOCUMENTS

| 7,402,901 | B2 | 7/2008 | Hatano et al. |
| 8,072,774 | B2 | 12/2011 | Tokoro |
| 8,304,896 | B2 | 11/2012 | England |
| 8,354,340 | B2 | 1/2013 | Kurita et al. |

(Continued)

OTHER PUBLICATIONS

International Search Report and Written Opinion—PCT/US2014/062683—ISA/EPO—Feb. 25, 2015.

*Primary Examiner* — Andargie M Aychillhum
(74) *Attorney, Agent, or Firm* — Loza & Loza, LLP

(57) ABSTRACT

Some novel features pertain to a substrate that includes a first dielectric layer and a bridge structure. The bridge structure is embedded in the first dielectric layer. The bridge structure is configured to provide an electrical connection between a first die and a second die. The first and second dies are configured to be coupled to the substrate. The bridge structure includes a first set of interconnects and a second dielectric layer. The first set of interconnects is embedded in the first dielectric layer. In some implementations, the bridge structure further includes a second set of interconnects. In some implementations, the second dielectric layer is embedded in the first dielectric layer. The some implementations, the first dielectric layer includes the first set of interconnects of the bridge structure, a second set of interconnects in the bridge structure, and a set of pads in the bridge structure.

30 Claims, 22 Drawing Sheets

Packaging Substrate

(56) References Cited

U.S. PATENT DOCUMENTS

| | | |
|---|---|---|
| 8,441,809 B2 | 5/2013 | Mahajan et al. |
| 2009/0244874 A1 | 10/2009 | Mahajan et al. |
| 2010/0327424 A1 | 12/2010 | Braunisch et al. |
| 2011/0240357 A1 | 10/2011 | Kariya et al. |
| 2012/0098126 A1* | 4/2012 | Iwasaki .................. H01L 24/11 257/737 |
| 2013/0168854 A1 | 7/2013 | Karikalan et al. |
| 2014/0117552 A1* | 5/2014 | Qian ................ H01L 23/49827 257/762 |
| 2014/0174807 A1 | 6/2014 | Roy et al. |
| 2014/0264791 A1 | 9/2014 | Manusharow et al. |

\* cited by examiner

EMBEDDED BRIDGE STRUCTURE IN A SUBSTRATE

BACKGROUND

Field

Various features relate to an embedded bridge structure in a substrate.

Background

FIG. 1 illustrates a semiconductor device configuration that includes a first die 100, a second die 102, an interposer 104, and a packaging substrate 106. As shown in FIG. 1, the first die 100 is coupled to the interposer 104 through a first set of solder balls 108. The second die 102 is coupled to the interposer 104 through a second set of solder balls 110. The interposer 104 includes a first set of interconnects 112 and a second set of interconnects 114. The first set of interconnects 112 is configured to provide an electrical connection between the first die 100 and the second die 102. In particular, the first die 100 is electrically coupled to the second die 102 through the first set of solder balls 108, the first set of interconnects 112, and the second set of solder balls 110.

The interposer 104 is coupled to the packaging substrate 106 through a third set of solder balls 116. The second set of interconnects 114 is configured to provide an electrical connection between the first die 100 and the package substrate 106. As shown in FIG. 1, the first die 100 is electrically coupled to the packaging substrate 106 through the first set of solder balls 108, the second set of interconnects 114, and the third set of solder balls 116.

FIG. 2 illustrates a semiconductor device configuration that includes a first die 200, a second die 202, a bridge structure 204, and a packaging substrate 206. As shown in FIG. 2, the first die 200 is coupled to the bridge structure 204 through a first set of bumps and solder balls 208. The second die 202 is coupled to the bridge structure 204 through a second set of bumps and solder balls 210. The bridge structure 204 includes a first set of interconnects 212 and a dielectric layer 214. The first set of interconnects 212 is a metal layer (e.g., copper). The bridge structure 204 is positioned on the packaging substrate 206. The bridge structure 204 is configured to provide an electrical connection between the first die 200 and the second die 202. Specifically, the first set of interconnects 212 of the bridge structure 204 is configured to provide an electrical connection between the first die 200 and the second die 202. In particular, the first die 200 is electrically coupled to the second die 202 through the first set of bumps and solder balls 208, the first set of interconnects 212, and the second set of bumps and solder balls 210.

FIG. 3 illustrates a semiconductor device configuration that includes a first die 300, a second die 302, a bridge structure 304, and a packaging substrate 306. As shown in FIG. 3, the first die 300 is coupled to the bridge structure 304 through a first set of bumps and solder balls 308. The second die 302 is coupled to the bridge structure 304 through a second set of bumps and solder balls 310. The bridge structure 304 includes a first set of interconnects 312 and a dielectric layer 314. The first set of interconnects 312 is a metal layer (e.g., copper). The bridge structure 304 is partially embedded in the packaging substrate 306. Specifically, the dielectric layer 314 of the bridge structure is embedded in the dielectric layer 320 of the packaging substrate 306. As further shown in FIG. 3, the first set of interconnects 312 of the bridge structure 304 is above the dielectric layer 320 of the packaging substrate. The bridge structure 304 is configured to provide an electrical connection between the first die 300 and the second die 302. Specifically, the first set of interconnects 312 of the bridge structure 304 is configured to provide an electrical connection between the first die 300 and the second die 302. In particular, the first die 300 is electrically coupled to the second die 302 through the first set of bumps and solder balls 308, the first set of interconnects 312, and the second set of bumps and solder balls 310.

There are several drawbacks to the semiconductor device configuration of FIGS. 1-3. For example, the configuration of FIGS. 1-2 creates a semiconductor device that is tall, and there is an ongoing need to manufacture smaller semiconductor devices. One of the downside of the semiconductor device configuration shown in FIG. 3 is that it is difficult to manufacture. Therefore, there is a need for a novel device (e.g., bridge structure) that provides electrical connections between dies. Ideally, such a novel semiconductor device will be easy to manufacture.

SUMMARY

Various features relate to an embedded bridge structure in a substrate.

A first example provides a substrate that includes a first dielectric layer and a bridge structure. The bridge structure is embedded in the first dielectric layer. The bridge structure is configured to provide an electrical connection between a first die and a second die. The first and second dies are configured to be coupled to the substrate. The bridge structure includes a first set of interconnects and a second dielectric layer. The first set of interconnects is embedded in the first dielectric layer.

According to an aspect, the bridge structure further includes a second set of interconnects.

According to one aspect, the second dielectric layer is embedded in the first dielectric layer.

According to an aspect, the first dielectric layer includes the first set of interconnects of the bridge structure, a second set of interconnects in the bridge structure, and a set of pads in the bridge structure.

According to one aspect, the bridge structure further includes a set of pads. In some implementations, the set of pads is configured to couple to a first set of bumps and interconnects for the first die. The set of pads is also configured to couple to a second set of bumps and interconnects for the second die.

According to an aspect, the substrate is a packaging substrate configured to be coupled to a printed circuit board.

According to one aspect, the substrate is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

A second example provides an apparatus that includes a first dielectric layer, and a bridge means embedded in the first dielectric layer. The bridge means is configured to provide an electrical connection between a first die and a second die. The first and second dies are configured to be coupled to the substrate. The bridge means includes a first set of interconnects and a second dielectric layer. The first set of interconnects is embedded in the first dielectric layer.

According to an aspect, the bridge means further includes a second set of interconnects.

According to one aspect, the second dielectric layer is embedded in the first dielectric layer.

According to an aspect, the first dielectric layer includes the first set of interconnects of the bridge means, a second set of interconnects in the bridge structure, and a set of pads in the bridge means.

According to one aspect, the bridge means further includes a set of pads.

According to an aspect, the set of pads is configured to couple to a first set of bumps and interconnects for the first die. The set of pads is also configured to couple to a second set of bumps and interconnects for the second die.

According to one aspect, the substrate is a packaging substrate configured to be coupled to a printed circuit board (PCB).

According to an aspect, the apparatus is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

A third example provides a method for providing a substrate. The method provides a first dielectric layer. The method provides a first set of interconnects embedded in the first dielectric layer so that the first set of interconnects is coupled via the first dielectric layer. The first set of interconnect is configured as a bridge structure in the first dielectric. The bridge structure is configured to provide an electrical connection between a first die and a second die. The method provides a second dielectric layer on the first set of interconnects.

According to an aspect, the method further provides a second set of interconnects in the first dielectric layer.

According to one aspect, the second dielectric layer is embedded in the first dielectric layer.

According to an aspect, the first dielectric layer includes the first set of interconnects of the bridge structure, a second set of interconnects in the bridge structure, and a set of pads in the bridge structure.

According to one aspect, the method further includes a set of pads coupled to the first set of interconnects. In some implementations, the set of pads is configured to couple to a first set of bumps and interconnects for the first die. The set of pads is also configured to couple to a second set of bumps and interconnects for the second die.

According to an aspect, the substrate is a packaging substrate configured to be coupled to a printed circuit board (PCB).

According to one aspect, the substrate is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

DRAWINGS

Various features, nature and advantages may become apparent from the detailed description set forth below when taken in conjunction with the drawings in which like reference characters identify correspondingly throughout.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

Overview

Some novel features pertain to a substrate that includes a first dielectric layer and a bridge structure. The bridge structure is embedded in the first dielectric layer. The bridge structure is configured to provide an electrical connection between a first die and a second die. The first and second dies are configured to be coupled to the substrate. The bridge structure includes a first set of interconnects and a second dielectric layer. The first set of interconnects is embedded in the first dielectric layer. In some implementations, the bridge structure further includes a second set of interconnects. In some implementations, the second dielectric layer is embedded in the first dielectric layer. The some implementations, the first dielectric layer includes the first set of interconnects of the bridge structure, a second set of interconnects in the bridge structure, and a set of pads in the bridge structure. In some implementations, the bridge structure further includes a set of pads. In some implementations, the set of pads is configured to couple to a first set of bumps and interconnects for the first die. The set of pads is also configured to couple to a second set of bumps and interconnects for the second die. In some implementations, the substrate is a packaging substrate configured to be coupled to a printed circuit board (PCB).

Exemplary Embedded Bridge Structure in a Substrate

Figure 1:
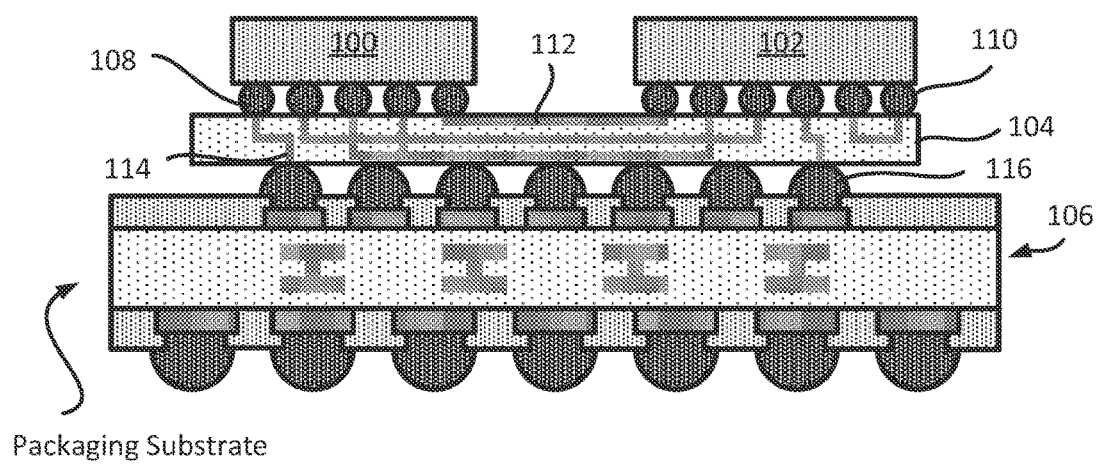
FIG. 1 illustrates an interposer configured to provide an electrical connections between two dies.
Figure 2:
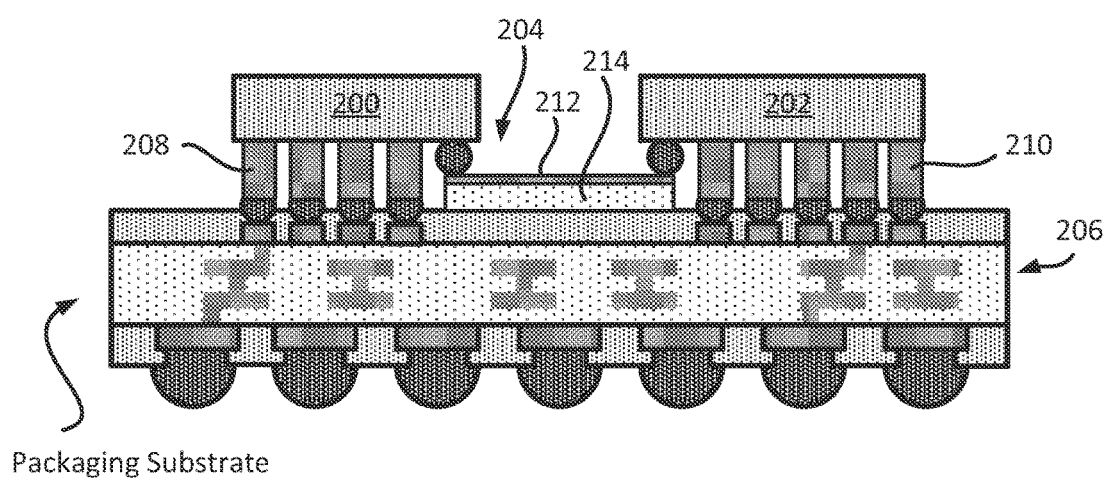
FIG. 2 illustrates a bridge structure on a substrate configured to provide an electrical connection between two dies.
Figure 3:
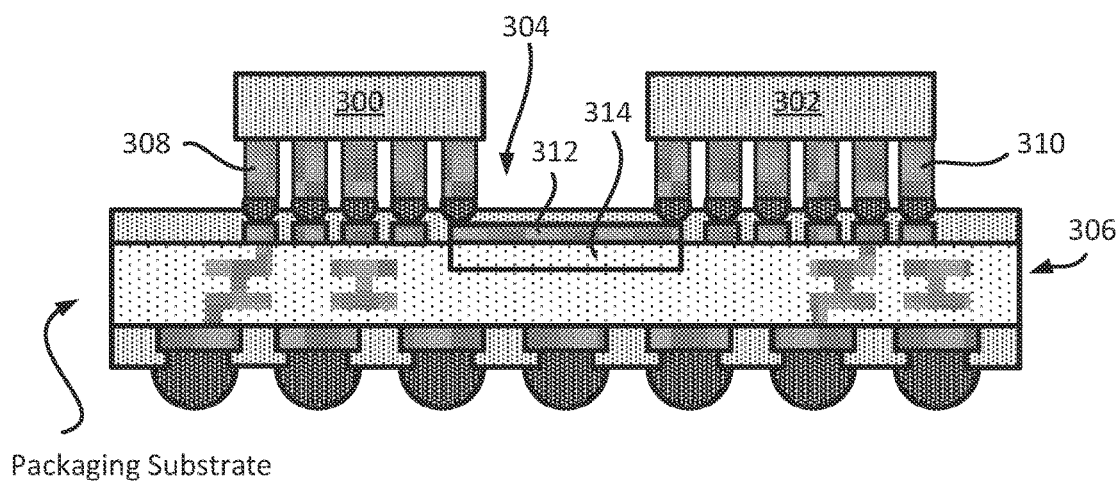
FIG. 3 illustrates another bridge structure on a substrate configured to provide an electrical connection between two dies.
Figure 4:
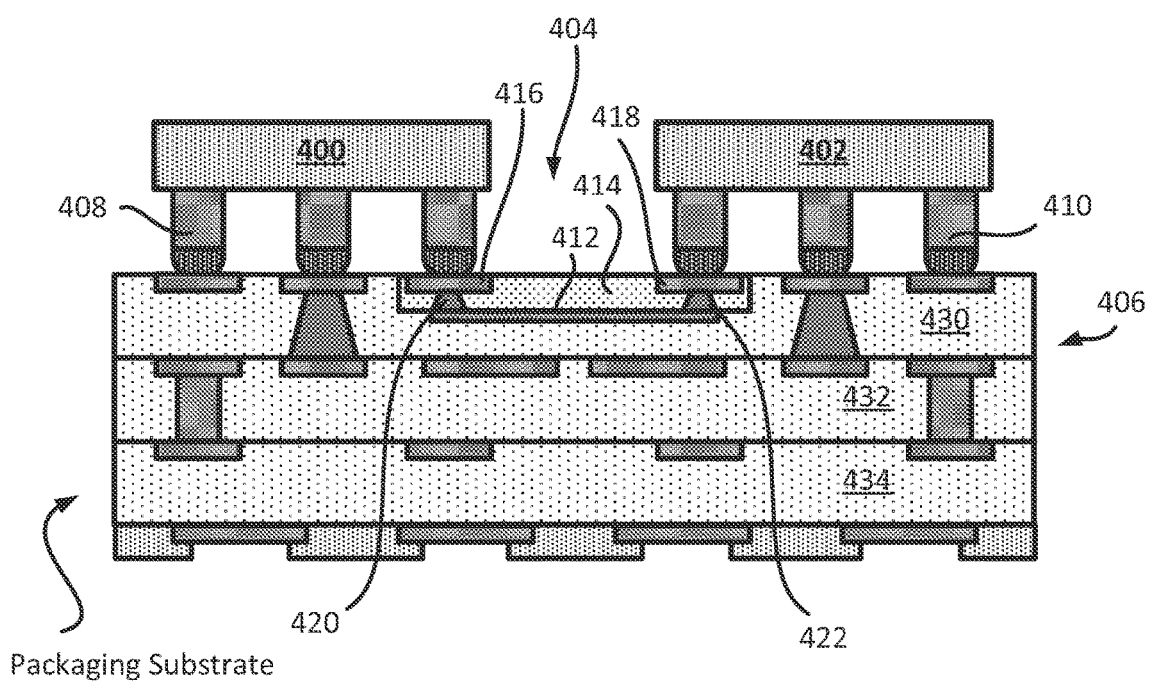
FIG. 4 illustrates a bridge structure embedded in a substrate configured to provide an electrical connection between two dies.

FIG. 4 illustrates a device configuration (e.g., semiconductor device configuration) that includes a first die 400, a second die 402, a bridge structure 404, and a substrate 406. In some implementations, the substrate 406 is a packaging substrate. The substrate 406 includes a first dielectric layer 430, a second dielectric layer 432, and a third dielectric layer 434. In some implementations, the first, second, and third dielectric layers 430, 432, and 434 may be a single dielectric layer of the substrate 406. As shown in FIG. 4, the first die 400 is coupled to the bridge structure 404 through a first set of interconnects 408. The first set of interconnects includes a set of bumps and solder balls in some implementations. The second die 402 is coupled to the bridge structure 404 through a second set of interconnects 410. The second set of interconnects 410 includes a set of bumps and solder balls in some implementations.

The bridge structure 404 includes a third set of interconnects 412, a dielectric layer 414, a first set of pads 416, a second set of pads 418, a first set of vias 420, and a second set of vias 422. The third set of interconnects 412 is a first metal layer (e.g., copper) of the bridge structure 404. The first and second sets of vias 420 and 422 are a second metal layer (e.g., copper) of the bridge structure 404. In some implementations, the bridge structure 404 is an embedded bridge structure.

As further shown in FIG. 4, the bridge structure 404 is embedded in the substrate 406. Specifically, the third set of interconnects 412 of the bridge structure 404 is embedded in the dielectric layer 430 of the substrate 406. The dielectric layer 414 is above the third set of interconnects 412. In some implementations, the bridge structure 404 is configured to provide an electrical connection between the first die 400 and the second die 402. Specifically, the third set of interconnects 412 of the bridge structure 404 is configured to provide an electrical connection between the first die 400 and the second die 402. In particular, the first die 400 is electrically coupled to the second die 402 through the first set of interconnects 408 (e.g., bumps and/or solder balls), the first set of pads 416, the first set of vias 420, the third set of interconnects 412, the second set of vias 422, the second set of pads 418, and the second set interconnects 410 (e.g., bumps and/or solder balls). In some implementations, the dielectric layer 414 of the bridge structure 404 is embedded in the first dielectric layer 430 of the substrate 406.

As further shown in FIG. 4, the dielectric layer 430 of the substrate 406 is configured to includes at least two metal layers, namely the first metal layer (e.g., third set of interconnects 412), and a second metal layer (e.g., set of pads 416 and/or 418).

Figure 5A:
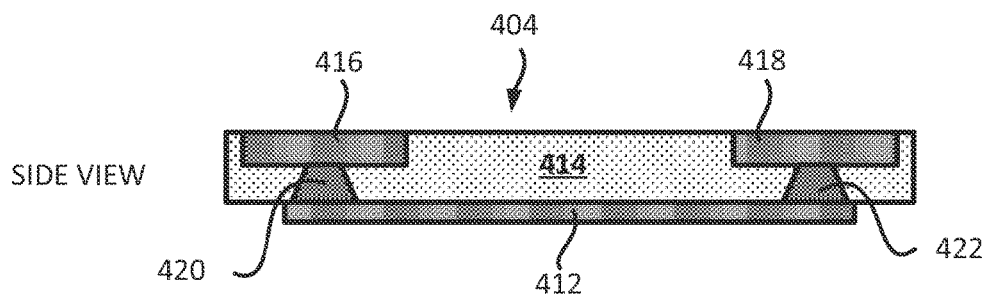
FIG. 5A illustrates a side view of an embedded bridge structure.
Figure 5B:
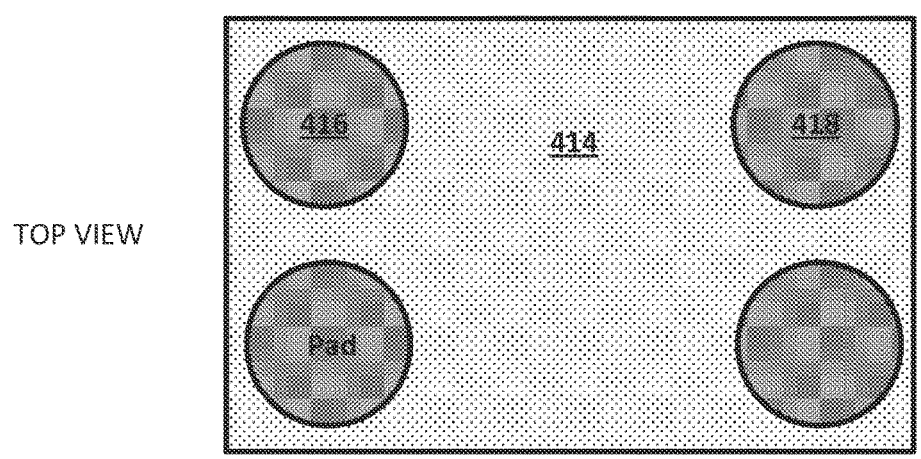
FIG. 5B illustrates a top view of an embedded bridge structure.
Figure 5C:
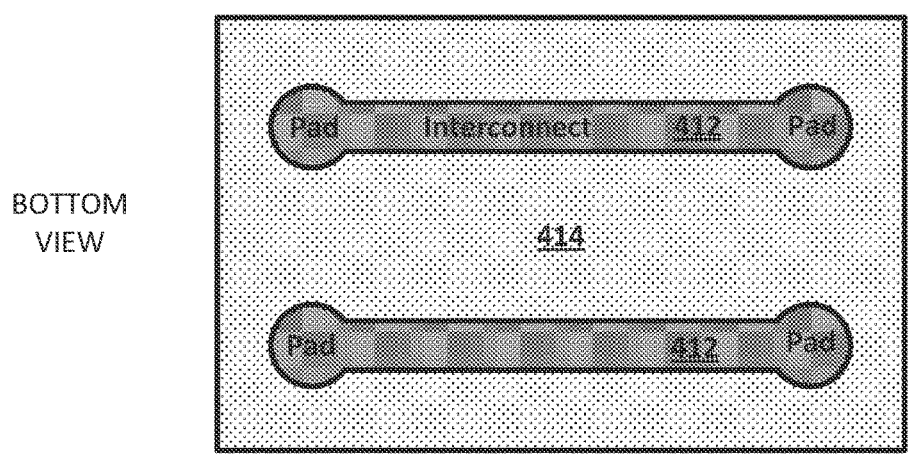
FIG. 5C illustrates a bottom view of an embedded bridge structure.

FIGS. 5A-5C illustrate side, top, and side views of the bridge substrate of FIG. 4. FIG. 5A illustrates a side view of the bridge structure 404 of FIG. 4. As shown in FIG. 5A, the bridge structure 404 includes the third set of interconnects 412, the dielectric layer 414, the first set of pads 416, the second set of pads 418, the first set of vias 420, and the second set of vias 422. The third set of interconnects 412 is the first metal layer (e.g., copper) of the bridge structure 404. The first and second sets of pads 420 and 422 are the second metal layer (e.g., copper) of the bridge structure 404. FIG. 5B illustrates a top view of the bridge structure 404 of FIG. 4. FIG. 5C illustrates a bottom view of the bridge structure 404 of FIG. 4. In some implementations, the bridge structure 404 is an embedded bridge structure in a substrate (e.g., dielectric layer of a package substrate).

One advantage of embedding the bridge structure 404 in the substrate 406, such that the third set of interconnects 412 is embedded in the substrate 406, is that dielectric layer 414 provides insulation of the third set of interconnects 412. In such instances, a solder resist layer may not be needed on the substrate 406. However, it should be noted that in some implementations, a solder resist layer may be provided over a surface of the substrate 406.

Exemplary Embedded Bridge Structure with Interconnect Layers in a Substrate

Figure 6:
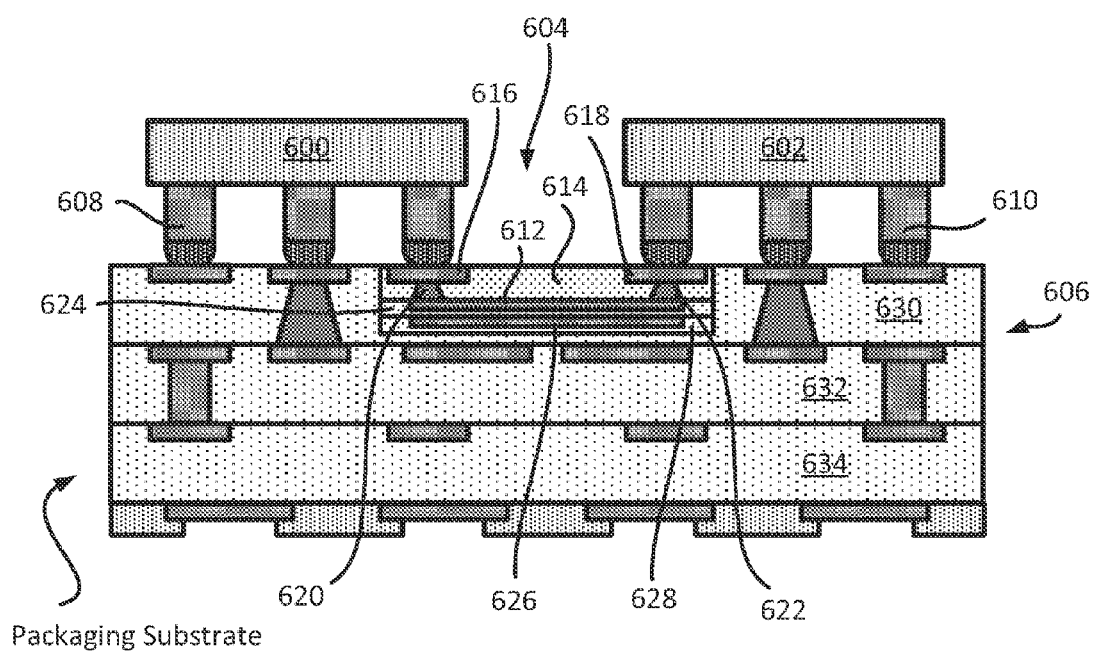
FIG. 6 illustrates another bridge structure embedded in a substrate configured to provide an electrical connection between two dies.

In some implementations, an embedded bridge structure may include several interconnect layers. FIG. 6 illustrates an example of such an embedded bridge structure. Specifically, FIG. 6 illustrates a device configuration (e.g., semiconductor device configuration) that includes a first die 600, a second die 602, a bridge structure 604, and a substrate 606. In some implementations, the substrate 606 is a packaging substrate. The substrate 606 includes a first dielectric layer 630, a second dielectric layer 632, and a third dielectric layer 634. In some implementations, the first, second, and third dielectric layers 630, 632, and 634 may a single dielectric layer of the substrate 606. As shown in FIG. 6, the first die 600 is coupled to the bridge structure 604 through a first set of interconnects 608. The first set of interconnects includes a set of bumps and solder balls in some implementations. The second die 602 is coupled to the bridge structure 604 through a second set of interconnects 610. The second set of interconnects 610 includes a set of bumps and solder balls in some implementations.

The bridge structure 604 includes a third set of interconnects 612, a dielectric layer 614, a first set of pads 616, a second set of pads 618, a first set of vias 620, and a second set of vias 622. The third set of interconnects 612 is a first metal layer (e.g., copper) of the bridge structure 604. The first and second sets of vias 620 and 622 are a second metal layer (e.g., copper) of the bridge structure 604. In some implementations, the bridge structure 604 is an embedded bridge structure.

As further shown in FIG. 6, the bridge structure 604 is embedded in the substrate 606. Specifically, the third set of interconnects 612 of the bridge structure 604 is embedded in the dielectric layer 630 of the substrate 606. The dielectric layer 614 is above the third set of interconnects 612. In some implementations, the bridge structure 604 is configured to provide an electrical connection between the first die 600 and the second die 602. Specifically, the third set of interconnects 612 of the bridge structure 604 is configured to provide an electrical connection between the first die 600 and the second die 602. In particular, the first die 600 is electrically coupled to the second die 602 through the first set of interconnects 608 (e.g., bumps and/or solder balls), the first set of pads 616, the first set of vias 620, the third set of interconnects 612, the second set of vias 622, the second set of pads 618, and the second set interconnects 610 (e.g., bumps and/or solder balls). In some implementations, the dielectric layer 614 of the bridge structure 604 is embedded in the first dielectric layer 630 of the substrate 606.

As further shown in FIG. 6, the dielectric layer 630 of the substrate 606 is configured to includes at least two metal layers, namely the first metal layer (e.g., third set of interconnects 612), and a second metal layer (e.g., set of pads 616 and/or 618).

Figure 7A:
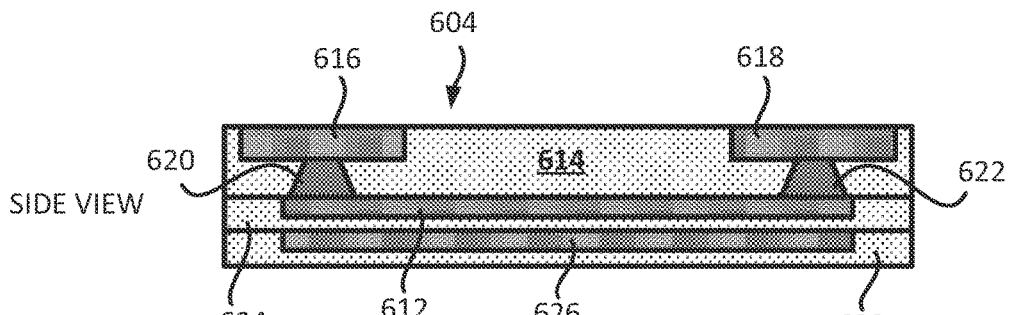
FIG. 7A illustrates a side view of an embedded bridge structure.
Figure 7B:
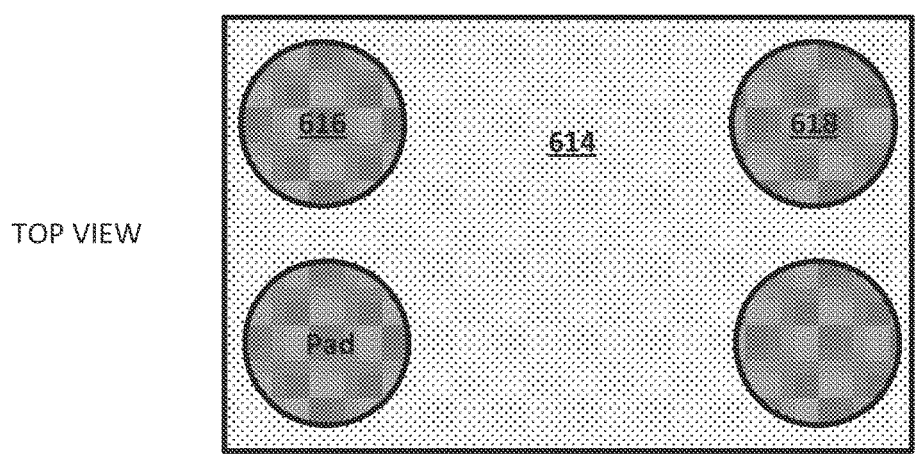
FIG. 7B illustrates a top view of an embedded bridge structure.
Figure 7C:
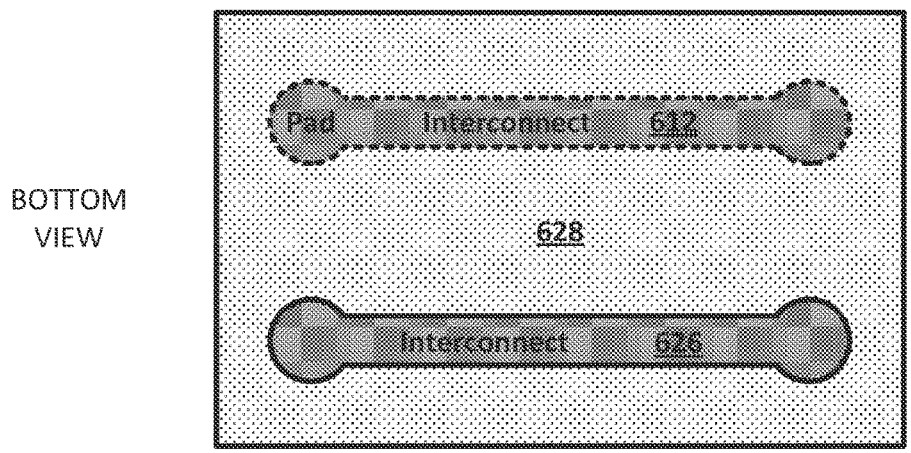
FIG. 7C illustrates a bottom view of an embedded bridge structure.

FIGS. 7A-7C illustrate side, top, and side views of the bridge substrate of FIG. 6. FIG. 7A illustrates a side view of the bridge structure 604 of FIG. 6. As shown in FIG. 7A, the bridge structure 604 includes the third set of interconnects 612, the dielectric layer 614, the first set of pads 616, the second set of pads 618, the first set of vias 620, and the second set of vias 622, and a fourth set of interconnects 626. The third set of interconnects 612 is the first metal layer (e.g., copper) of the bridge structure 604. The first and second sets of pads 620 and 622 are the second metal layer (e.g., copper) of the bridge structure 604. The fourth set of interconnects 626 is the third metal layer (e.g., copper) of the bridge structure 604. FIG. 7B illustrates a top view of the bridge structure 604 of FIG. 6. FIG. 7C illustrates a bottom view of the bridge structure 604 of FIG. 6. In FIG. 7C, the third set of interconnects 612 is shown dotted to represent the fact that the third set of interconnects is covered by the dielectric layer 628. In some implementations, the bridge structure 604 is an embedded bridge structure in a substrate (e.g., dielectric layer of a package substrate).

In some implementations, the dielectric layer (e.g., dielectric layers 614) of an embedded bridge structure may extend beyond the length and/or width of the embedded bridge structure. For example, the dielectric layer may cover some or all of the substrate, in some implementations.

Figure 8:
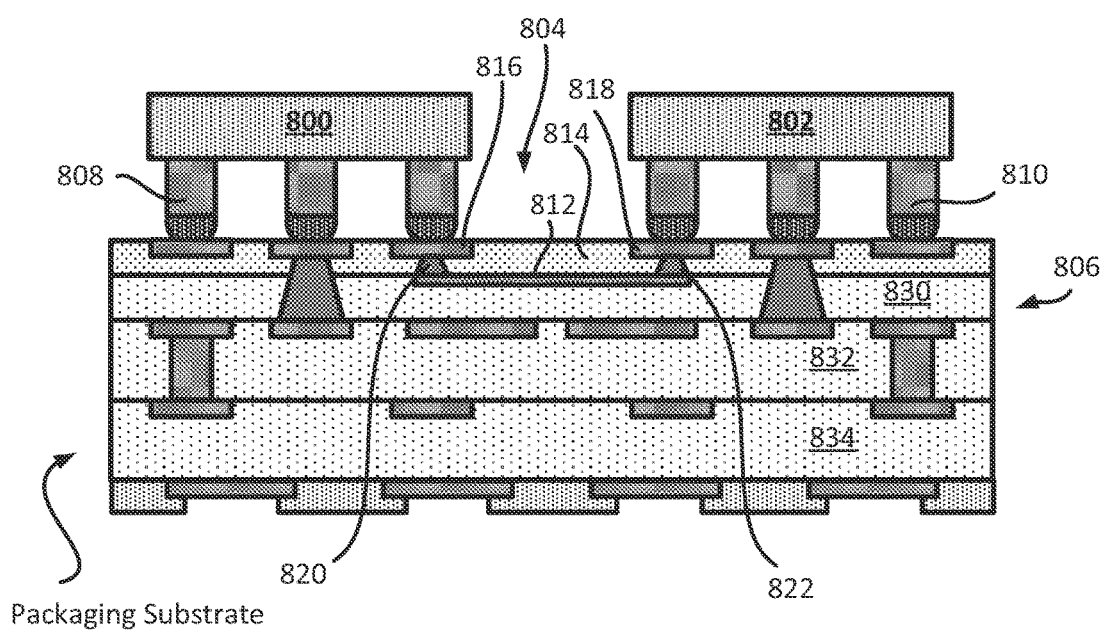
FIG. 8 illustrates another bridge structure embedded in a substrate configured to provide an electrical connection between two dies.

FIG. 8 illustrates an example of substrate that includes an embedded bridge structure, where the dielectric layer that covers the bridged structure also covers other portions of the substrate. Specifically, FIG. 8 illustrates a device configuration (e.g., semiconductor device configuration) that includes a first die 800, a second die 802, a bridge structure 804, and a substrate 806. In some implementations, the substrate 806 is a packaging substrate. The substrate 806 includes a first dielectric layer 830, a second dielectric layer 832, and a third dielectric layer 834. In some implementations, the first, second, and third dielectric layers 830, 832, and 834 may a single dielectric layer of the substrate 806. As shown in FIG. 8, the first die 800 is coupled to the bridge structure 804 through a first set of interconnects 808. The first set of interconnects includes a set of bumps and solder balls in some implementations. The second die 802 is coupled to the bridge structure 804 through a second set of interconnects 810. The second set of interconnects 810 includes a set of bumps and solder balls in some implementations.

The bridge structure 804 includes a third set of interconnects 812, a dielectric layer 814, a first set of pads 816, a second set of pads 818, a first set of vias 820, and a second set of vias 822. The third set of interconnects 812 is a first metal layer (e.g., copper) of the bridge structure 804. The first and second sets of vias 820 and 822 are a second metal layer (e.g., copper) of the bridge structure 804. In some implementations, the bridge structure 804 is an embedded bridge structure.

As further shown in FIG. 8, the bridge structure 804 is embedded in the substrate 806. Specifically, the third set of interconnects 812 of the bridge structure 804 is embedded in the dielectric layer 830 of the substrate 806. The dielectric layer 814 is above the third set of interconnects 812. In particular the dielectric layer 814 covers more than the third set of interconnects 812, including other parts of the substrate 806. In some implementations, the bridge structure 804 is configured to provide an electrical connection between the first die 800 and the second die 802. Specifically, the third set of interconnects 812 of the bridge structure 804 is configured to provide an electrical connection between the first die 800 and the second die 802. In particular, the first die 800 is electrically coupled to the second die 802 through the first set of interconnects 808 (e.g., bumps and/or solder balls), the first set of pads 816, the first set of vias 820, the third set of interconnects 812, the second set of vias 822, the second set of pads 818, and the second set interconnects 810 (e.g., bumps and/or solder balls).

It should be noted that the embedded bridge structures described in the present disclosure is not obvious, as the process of providing/manufacturing a substrate that includes an embedded bridge structure (e.g., bridge structures 404, 604, 804) is not obvious to one or ordinary skill in the art.

Having described several bridge structures embedded in a substrate, a sequence for providing and/or manufacturing a substrate that includes an embedded bridge structure will now be described below. The sequence and method described below provides an efficient and cost effective process for providing and/or manufacturing a substrate that includes an embedded bridge structure.

Exemplary Sequence for Providing/Manufacturing a Substrate that Includes an Embedded Bridge Structure FIGS. 9A-9K illustrate an exemplary sequence for providing/manufacturing a substrate (e.g., package substrate) that includes an embedded bridge structure. It should be noted that for the purpose of clarity and simplification, the sequence of FIGS. 9A-9K do not necessarily include all the steps and/or stages of providing/manufacturing a substrate that includes one or more embedded bridge structure. Moreover, in some instances, several steps and/or stages may have been combined into a single step and/or stage in order to simplify the description of the sequences. In some implementations, the process of FIGS. 9A-9K is a modified Semi-Additive Process (mSAP). In some implementations, the process of FIGS. 9A-9K is a Semi-Additive Process (SAP).

Figure 9A:
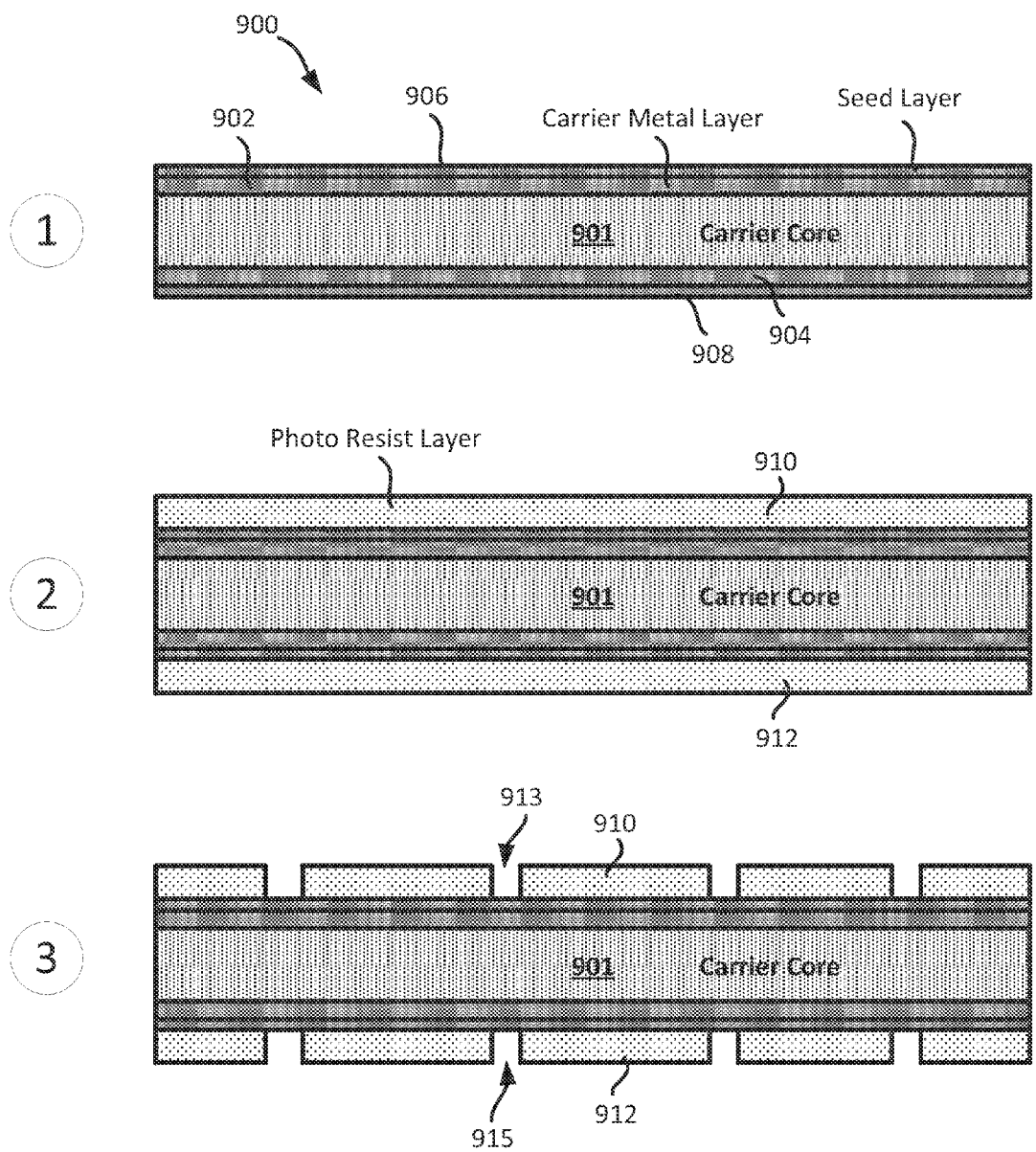
FIG. 9A illustrates part of a sequence for providing a substrate that includes an embedded bridge structure.

As shown in FIG. 9A, a carrier substrate 900 is provided (at stage 1). The carrier substrate 900 may include a carrier core 901, a first carrier metal layer 902, a second metal layer 904, a first seed layer 906, and a second seed layer 908. In some implementations, the carrier core 901 is a dielectric layer (e.g., cured dielectric layer). The first carrier metal layer 902 is on a first surface (e.g., top surface) of the carrier core 901. The second carrier metal layer 904 is on a second surface (e.g., bottom surface) of the carrier core 901. In some implementations, the first carrier metal layer 902 and the second carrier metal layer 904 are a copper layer. The first seed layer 906 is on the first carrier metal 902. The second seed layer 908 is on the second carrier metal 904. In some implementations, the first and second seed layers 906-1408 are copper layers.

A first photo resist layer 910 and a second photo resist layer 912 are provided (at stage 2) on the carrier substrate 900. Specifically, the first photo resist layer 910 is provided on the first seed layer 906 and the second photo resist layer 912 is provided on the second seed layer 908.

The first and second photo resist layers 910-912 may be selectively etched (at stage 3) to selectively remove some of the photo resist layers 910-912. Different implementations may use different processes to etch the first and second photo resist layers 910-912. In some implementations, etching the first and second photo resist layers 910-912 may create one or more cavities (e.g., first cavity 913, second cavity 915) in the first and second photo resist layer 910-912. For example, etching the first photo resist layer 910 creates a first cavity 913 in the first photo resist layer 910, and etching the second photo resist layer 912 creates a second cavity 915 in the second photo resist layer 912.

Figure 9B:
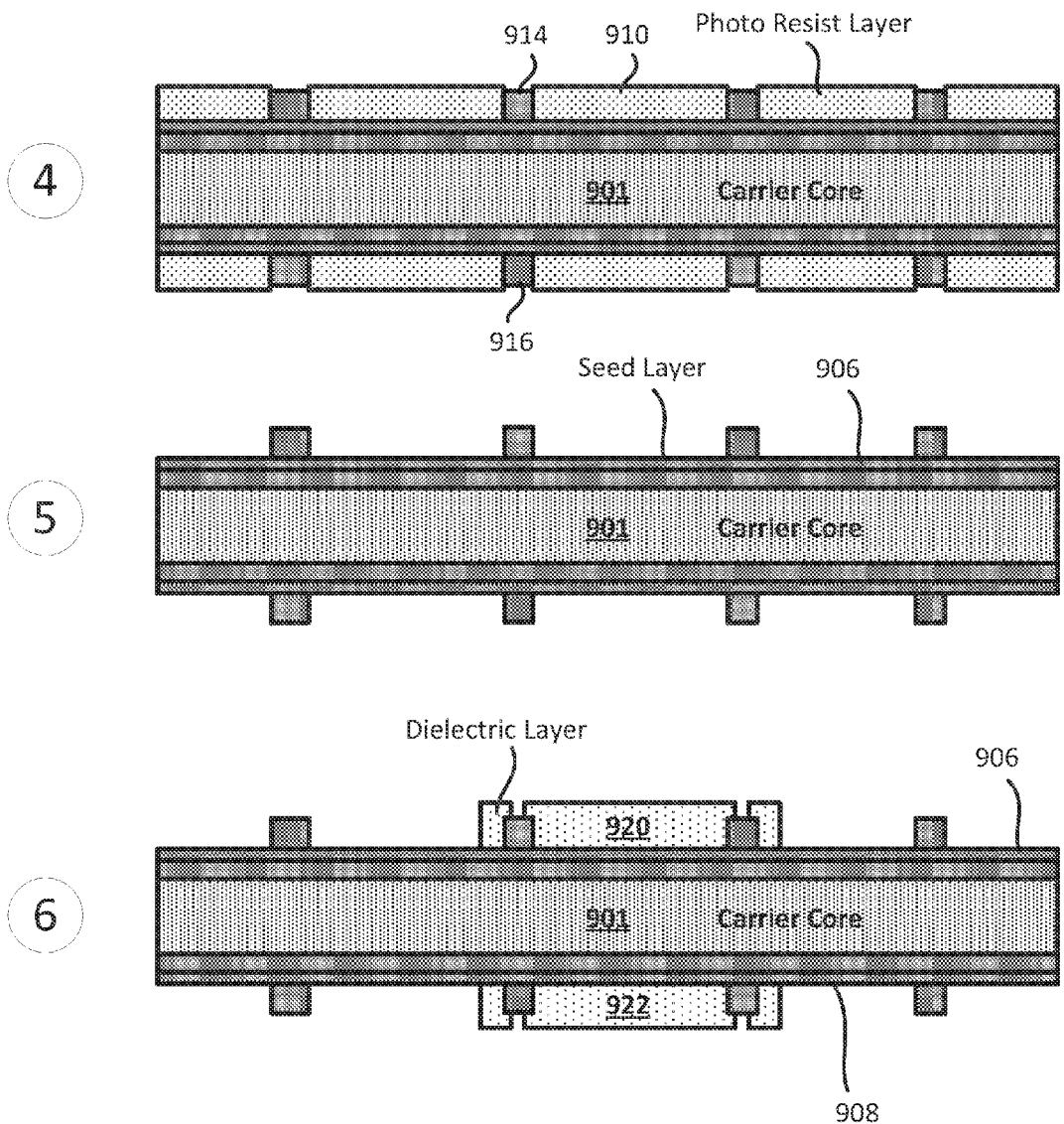
FIG. 9B illustrates part of a sequence for providing a substrate that includes an embedded bridge structure.

As shown in FIG. 9B, a first metal layer and a second metal layer are provided (at stage 4) on the carrier substrate 900. In some implementations, the first metal layer is provided in the cavities of the first photo resist layer 910. For example, the first metal layer 914 is provided in the first cavity 913. In some implementations, the first metal layer is a metal plating layer (e.g., copper plating layer). In some implementations, a second metal layer is provided in the cavities of the second photo resist layer 912. For example, the second metal layer 916 is provided in the second cavity 915. In some implementations, the second metal layer is a metal plating layer (e.g., copper plating layer).

The first and second photo resist layers 910-912 are removed (at stage 5). Different implementations may use different processes for removing the first and second photo resist layers 910-912. As shown at stage 5, removing the first and second photo resist layers 910-912 leaves the first metal layer 914 and the second metal layer 916 on the carrier substrate 900.

A first dielectric layer 920 and a second dielectric layer 922 are selectively provided (at stage 6) on the substrate 900. In some implementations, the first dielectric layer 920 is only provided on a portion of a first surface (e.g., top surface) of the substrate 900. In some implementations, the second dielectric layer 922 is only provided on a portion of a second surface (e.g., bottom surface) of the substrate 900. In some implementations, providing the first and second dielectric layers 920 and 922 may include selectively etching some of the first and second dielectric layer 920 and 922.

A first metal layer and a second metal layer are provided (at stage 7). Specifically, a first seed layer 921 is provided on the first dielectric layer 920, and a second seed layer 923 is provided on the second dielectric layer 922. In some implementations, the first and second seed layers 921 and 923 are copper metal layers.

A first photo resist layer 924 and a second photo resist layer 926 are selectively provided (at stage 8). Specifically, the first photo resist layer 924 is provided on a first surface of the substrate 900, and the second photo resist layer 926 is provided on a second surface of the substrate 900. In some implementations, selectively providing the first photo resist layer 924 including coating the first surface of the substrate 900 with the first photo resist layer 924 and/or exposing and/or developing the first photo resist layer 924. In some implementations, providing the first photo resist layer 924 may include etching some of the first photo resist layer 924. In some implementations, selectively providing the second photo resist layer 926 including coating the second surface of the substrate 900 with the second photo resist layer 926 and/or exposing and/or developing the second photo resist layer 926. In some implementations, providing the second photo resist layer 926 may include etching some of the second photo resist layer 926.

A first metal layer 927 and a second metal layer 929 are selectively provided (at stage 9). The first metal layer 927 is selectively provided over the first seed layer 921. The second metal layer 929 is selectively provided over the second seed layer 923.

The first and second photo resist layers 924 and 926 are removed (at stage 10). Different implementations may use different processes to remove the first and second photo resist layers 924 and 926.

In some implementations, a first bridge structure 918 (e.g., first embedded bridge structure) may be defined by the first dielectric layer 920, the first seed layer 921 and the first metal layer 927. In some implementations, a second bridge structure 919 (e.g., second embedded bridge structure) may be defined by the second dielectric layer 922, the second seed layer 923 and the second metal layer 929.

A first dielectric layer 930 and a metal layer 932 are provided (at stage 11) on a first surface (e.g., top surface) of the carrier substrate 900. In some implementations, the first dielectric layer 930 covers some or all of the first metal layer 914. In some implementations, the first dielectric layer 930 covers some or the entire first seed layer 906. A second dielectric layer 934 and a metal layer 936 are also provided (at stage 11) on a second surface (e.g., bottom surface) of the carrier substrate 900. In some implementations, the second dielectric layer 934 covers some or all of the second metal layer 916. In some implementations, the second dielectric layer 934 covers some or the entire second seed layer 908.

Figure 9C:
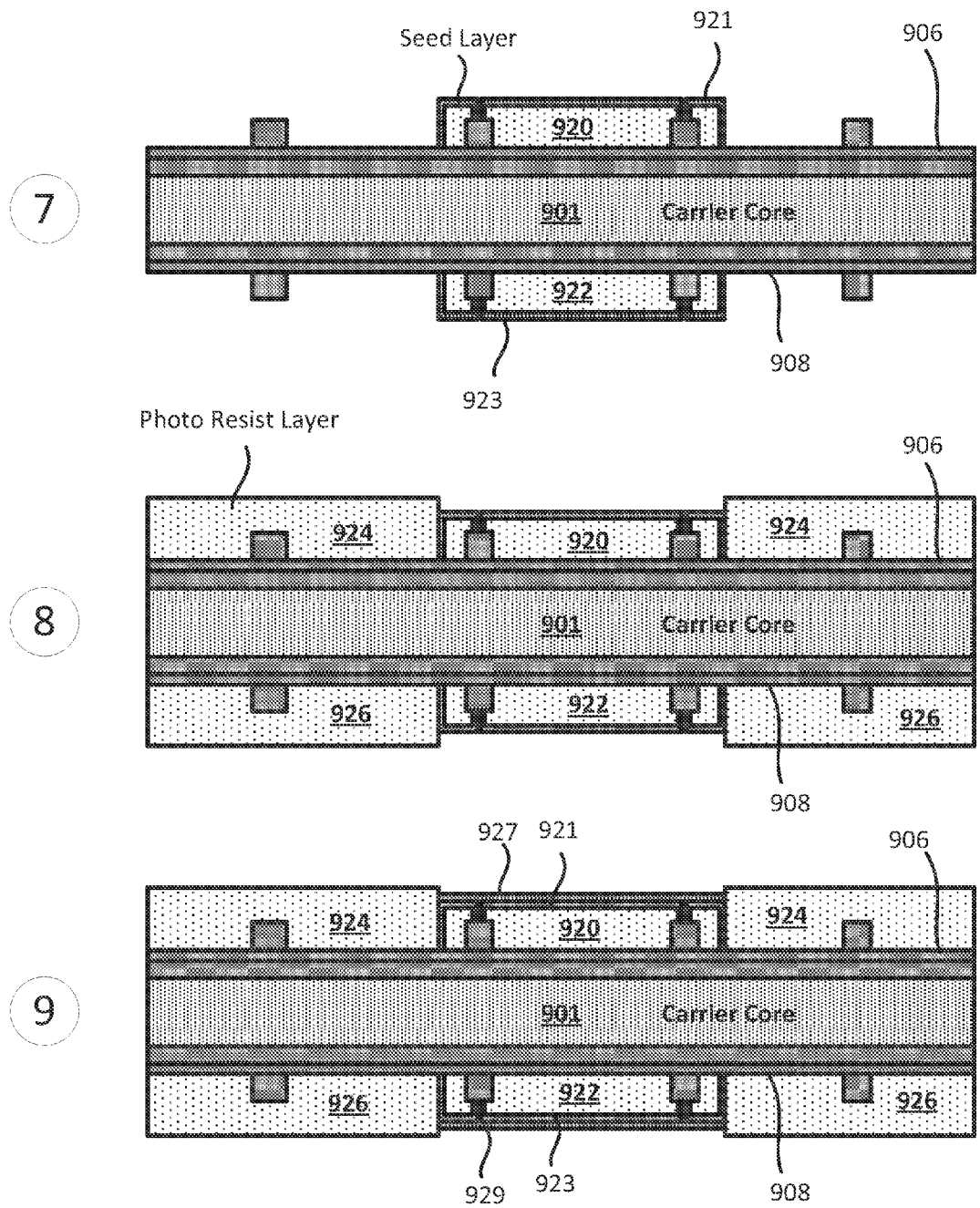
FIG. 9C illustrates part of a sequence for providing a substrate that includes an embedded bridge structure.
Figure 9D:
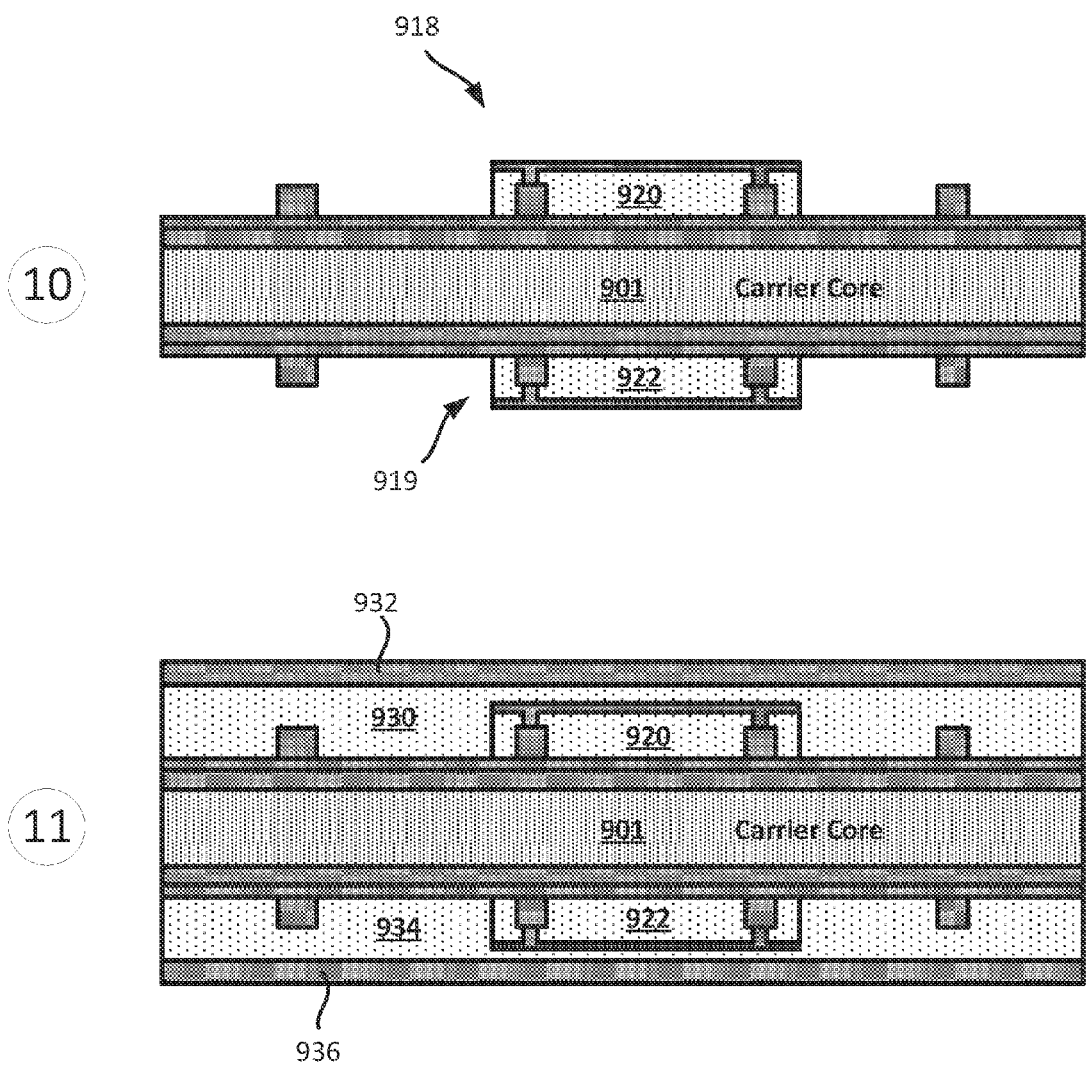
FIG. 9D illustrates part of a sequence for providing a substrate that includes an embedded bridge structure.
Figure 9E:
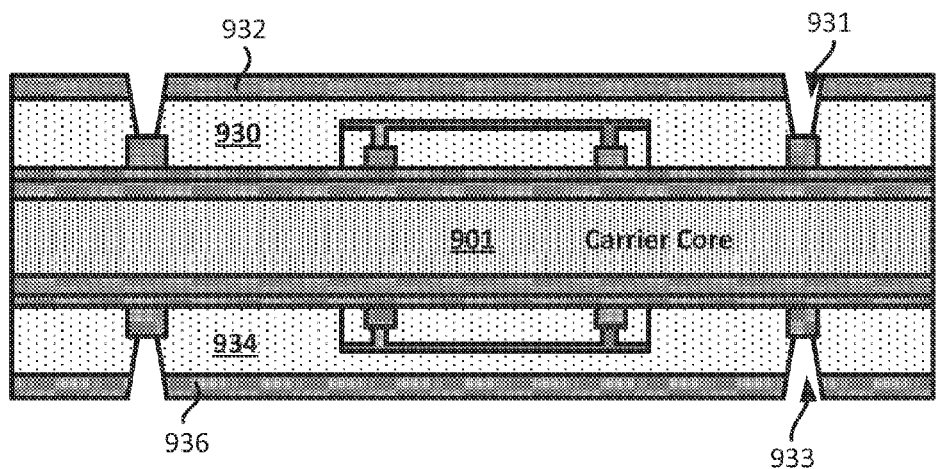
FIG. 9E illustrates part of a sequence for providing a substrate that includes an embedded bridge structure.
Figure 9E:
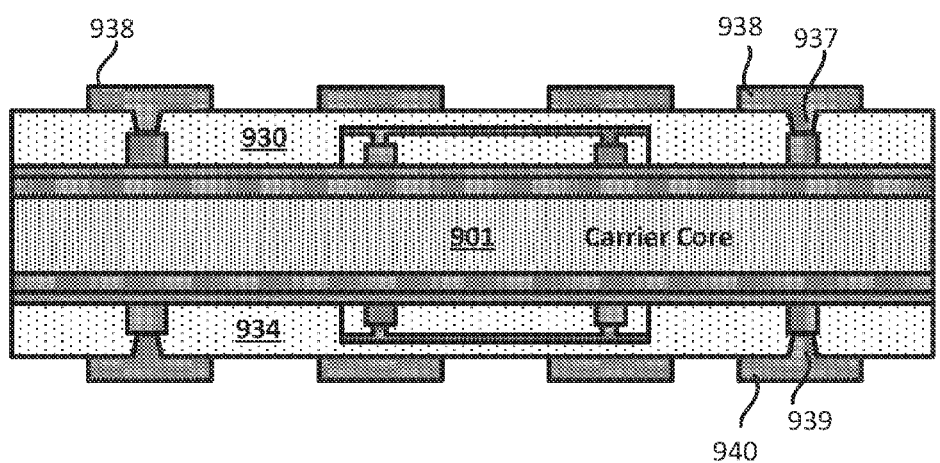

As shown in FIG. 9D, the first dielectric layer 930 and the metal layer 932 may be selectively etched (at stage 12) to selectively remove some of the first dielectric layer 930 and the metal layer 932. Different implementations may use different processes to etch the first dielectric layer 930 and the metal layer 932. In some implementations, etching the first dielectric layer 930 and the metal layer 932 may create one or more cavities (e.g., cavity 931) in the first dielectric layer 930 and the metal layer 932. In some implementations, the created cavities are via cavities. For example, etching the first dielectric layer 930 and the metal layer 932 creates the cavity 931 in the first dielectric layer 930 and the metal layer 932.

As further shown in FIG. 9D, the second dielectric layer 934 and the metal layer 936 may be selectively etched (at stage 12) to selectively remove some of the second dielectric layer 934 and the metal layer 936. Different implementations may use different processes to etch the second dielectric layer 934 and the metal layer 936. In some implementations, etching the second dielectric layer 934 and the metal layer 936 may create one or more cavities (e.g., cavity 933) in the second dielectric layer 934 and the metal layer 936. In some implementations, the created cavities are via cavities. For example, etching the second dielectric layer 934 and the metal layer 936 creates the cavity 933 in the second dielectric layer 934 and the metal layer 936. In some implementations, an additional metal layer (not shown) may be added on top of the metal layer 932, and the metal layer 936. In such instances, the metal layers 932 and 936 may be copper seed layers.

At stage 13, a patterning process is provided on the carrier substrate 900. In some implementations, patterning includes providing a metal layer in the cavities (e.g., first cavity 931, second cavity 933), which may define one or more via cavities. For example, filling the via cavity 931 with a metal layer (e.g., copper layer) provides a first via 937 in the first dielectric layer 930, and filling the via cavity 933 with a metal layer (e.g., copper layer) provides a second via 939 in the second dielectric layer 934. In addition, patterning (at stage 13) may include creating one more via pads by selectively etching the metal layers 932 and 936. For example, selectively etching the metal layer 932 may create a first via pad 938. The first via pad 938 is coupled to the first via 934. In some implementations, selectively etching the metal layer 926 may create a second via pad 940. The second via pad 940 is coupled to the second via 936.

Figure 9F:
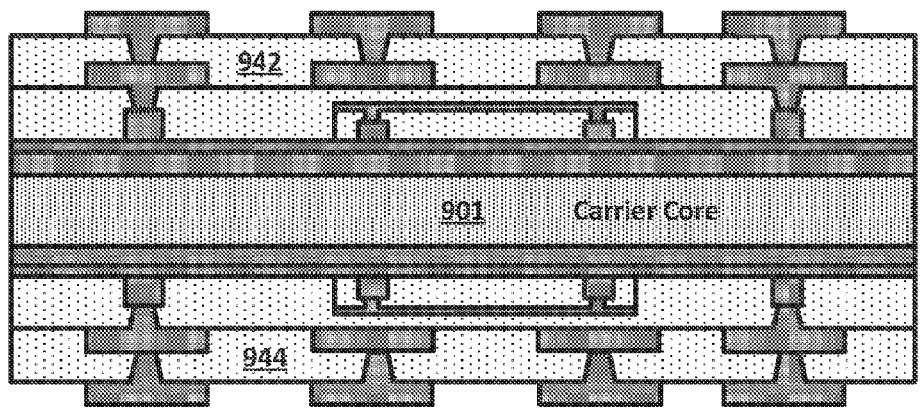
FIG. 9F illustrates part of a sequence for providing a substrate that includes an embedded bridge structure.
Figure 9F:
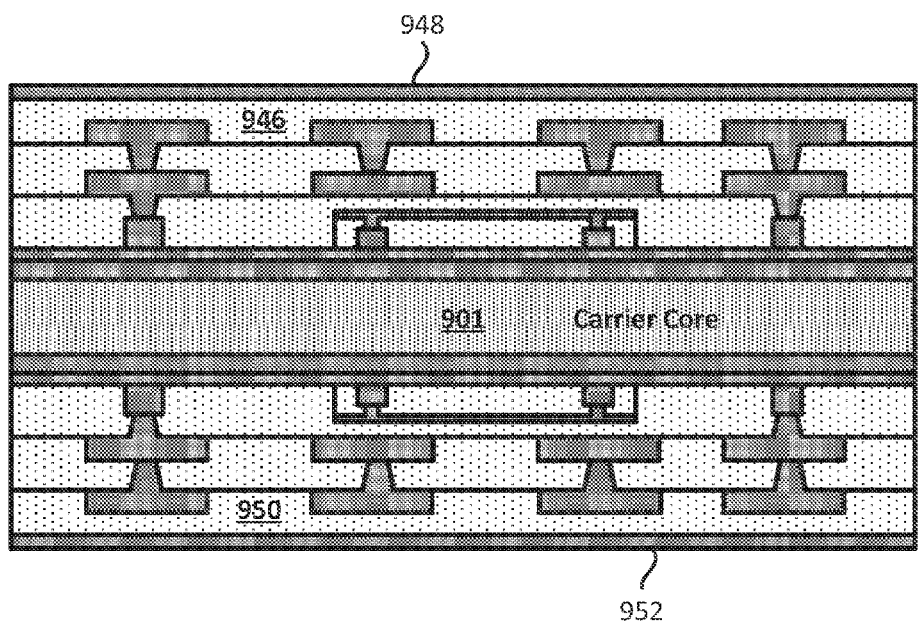

In some implementations, stages 12 and 13 may be repeated several times (e.g., more than once) to create several dielectric layers, vias, and/or pads in the carrier substrate 900. Stage 14 of FIG. 9F illustrates additional dielectric layers, vias, and/or pads being provided on the carrier substrate 900. Stage 14 of FIG. 9F illustrates the carrier substrate 900 after the process of stages 7 and 8 being applied again in some implementations. As shown in stage 14, a third dielectric layer 942 and a fourth dielectric layer 944 are provided.

A fifth dielectric layer 946 and a metal layer 948 are provided (at stage 15) on a first surface (e.g., top surface) of the carrier substrate 900. A sixth dielectric layer 950 and a metal layer 952 are also provided (at stage 15) on a second surface (e.g., bottom surface) of the carrier substrate 900. In some implementations, an additional metal layer (not shown) may be added on top of the metal layer 948 and the metal layer 952. In such instances, the metal layers 948 and 952 may be copper seed layers.

Figure 9G:
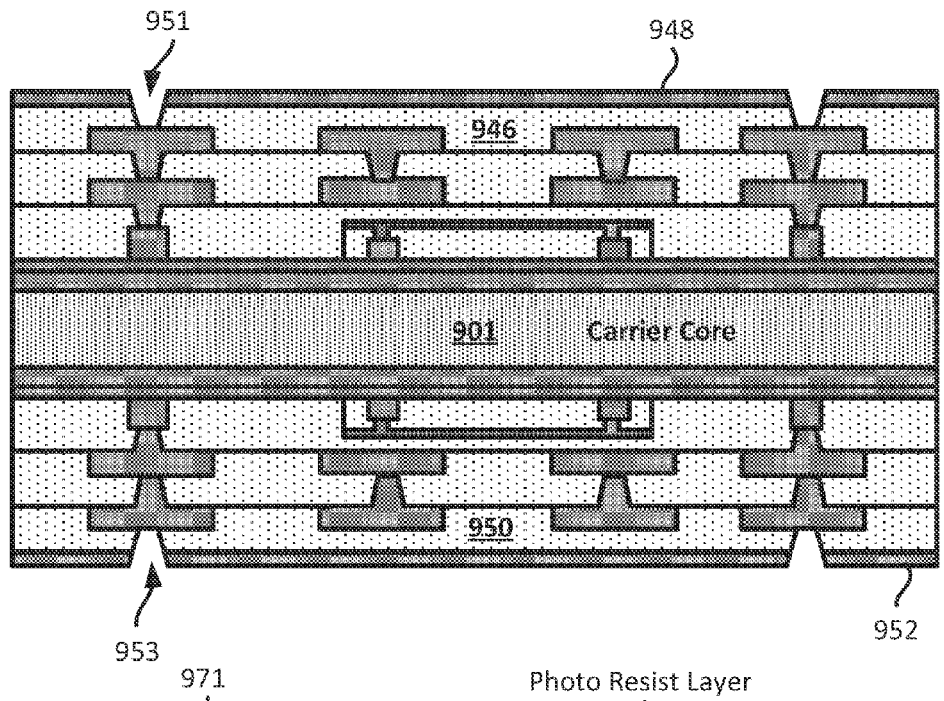
FIG. 9G illustrates part of a sequence for providing a substrate that includes an embedded bridge structure.
Figure 9G:
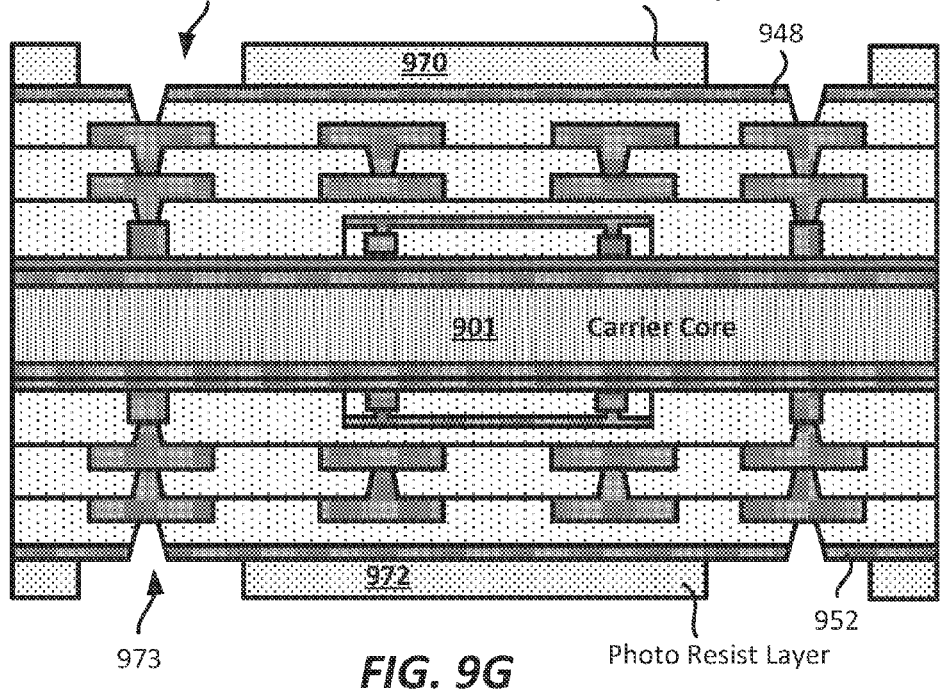

As shown in FIG. 9G, the fifth dielectric layer 946 and the metal layer 948 may be selectively etched (at stage 16) to selectively remove some of the fifth dielectric layer 946 and the metal layer 948. Different implementations may use different processes to etch the fifth dielectric layer 946 and the metal layer 948. In some implementations, etching the fifth dielectric layer 946 and the metal layer 948 may create one or more cavities (e.g., cavity 951) in the fifth dielectric layer 946 and the metal layer 948. In some implementations, the created cavities are via cavities. For example, etching the fifth dielectric layer 946 and the metal layer 948 creates the cavity 951 in the fifth dielectric layer 946 and the metal layer 948.

FIG. 9G also illustrates that the sixth dielectric layer 950 and the metal layer 952 may be selectively etched (at stage 16) to selectively remove some of the sixth dielectric layer 950 and the metal layer 952. Different implementations may use different processes to etch the sixth dielectric layer 950 and the metal layer 952. In some implementations, etching the sixth dielectric layer 950 and the metal layer 952 may create one or more cavities (e.g., cavity 953) in the sixth dielectric layer 950 and the metal layer 952. In some implementations, the created cavities are via cavities. For example, etching the sixth dielectric layer 950 and the metal layer 952 creates the cavity 953 in the sixth dielectric layer 950 and the metal layer 952.

Stage 17 of FIG. 9G illustrates a substrate after a first photo resist layer 970 and a second photo resist layer 972 have been applied (e.g., provided) on the substrate and selectively etched. In some implementations, etching the first and second photo resist layers 970 & 972 includes exposing the photo resist layers 970 & 972 and developing the first and second photo resist layers 970 & 972. However, different implementations, may selectively etch the photo resist layers 970 & 972. In some implementations, selectively etching the first and second photo resist layers 970 & 972 may create one or more cavities (e.g., cavity 971, cavity 973) in the first and second photo resist layers 970 & 972.

Figure 9H:
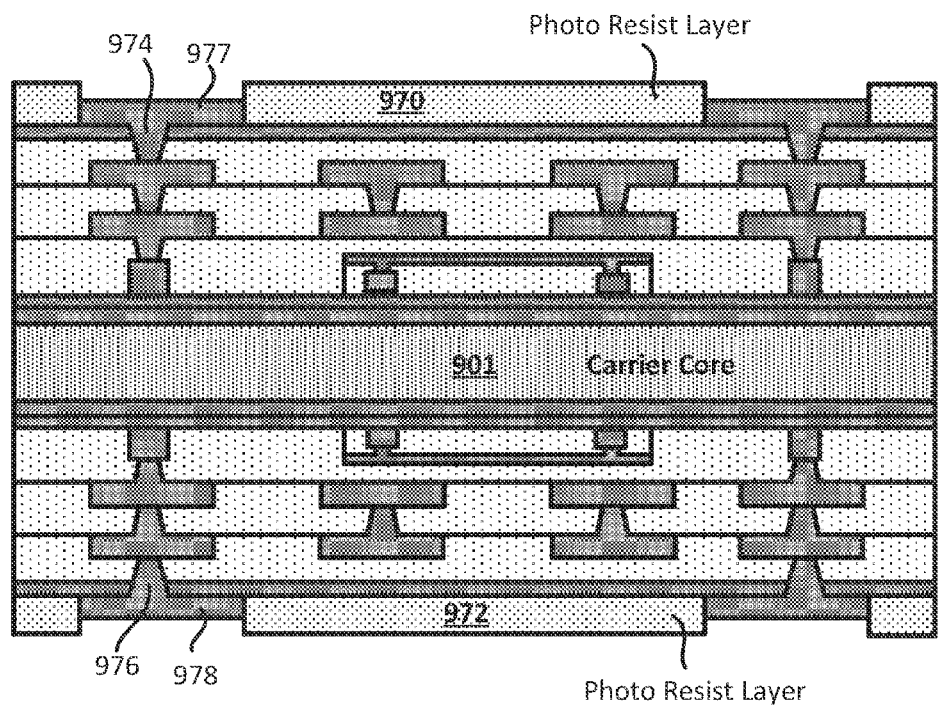
FIG. 9H illustrates part of a sequence for providing a substrate that includes an embedded bridge structure.
Figure 9H:
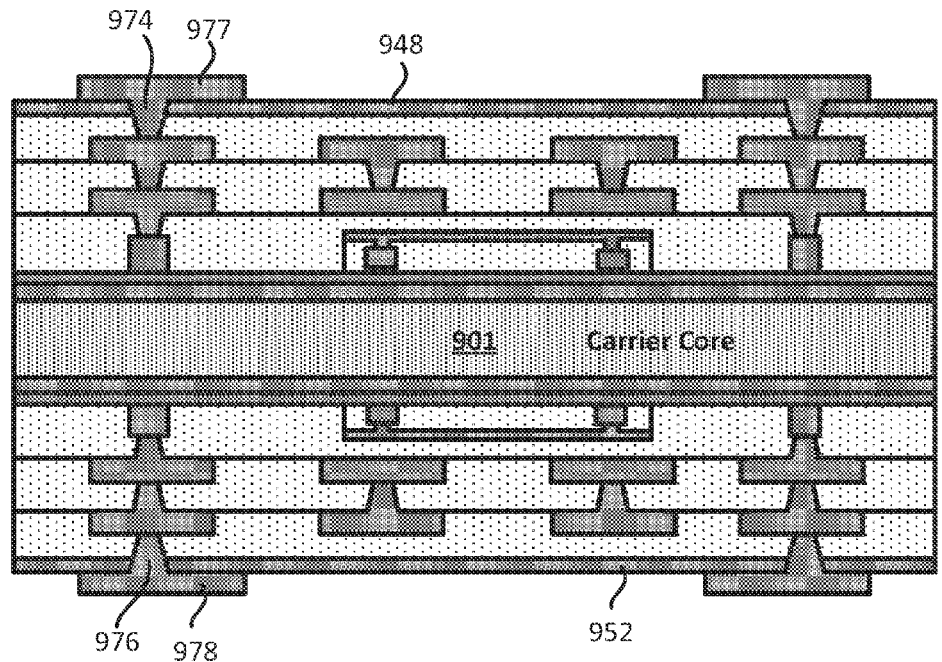

As shown in FIG. 9H, at stage 18, a patterning process is provided on the substrate (e.g., substrate 900). In some implementations, patterning includes providing a metal layer in the cavities (e.g., cavity 951, cavity 953, cavity 971, cavity 971), which may define one or more interconnects (e.g., traces), vias and/or via pads. In some implementations, the patterning process may include a patterning plating process. In some implementations, the metal layer may be a copper metal layer. For example, in some implementations, filling the via cavity 951 with a metal layer (e.g., copper layer) provides a via 974, filing the cavity 971 with a metal layer (e.g., copper layer) provides an interconnect 977 (e.g., trace, pad), and filling the cavities 953 and 973 with a metal layer (e.g., copper layer) provides a via 976 and an interconnect 978 (e.g., trace, pad).

The first and second photo resist layers 970 and 972 are removed (at stage 19). Different implementations may remove the photo resist layers 970 and 972 differently.

Figure 9I:
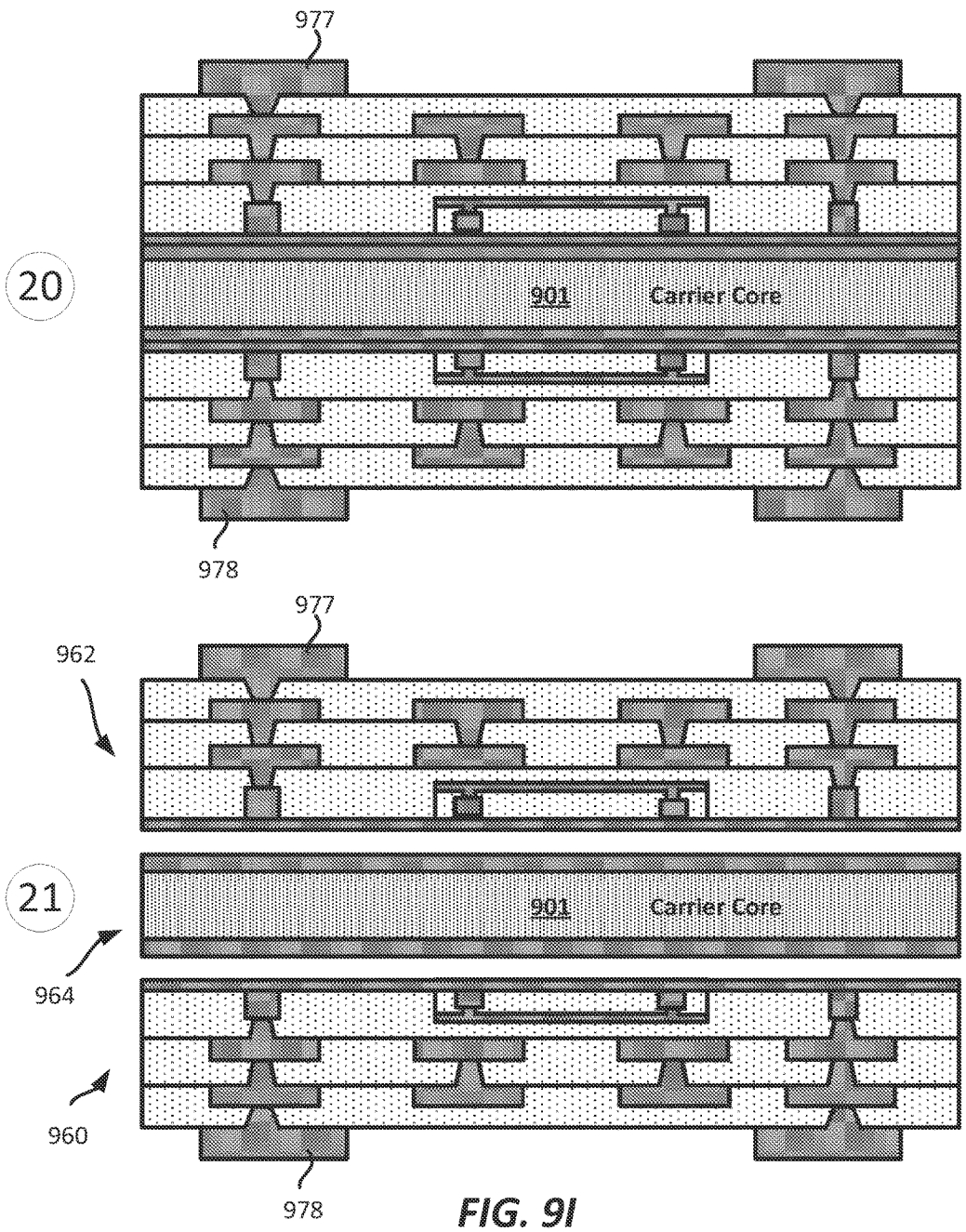
FIG. 9I illustrates part of a sequence for providing a substrate that includes an embedded bridge structure.

As shown in FIG. 9I, at stage 20, the metal layers (e.g., metal layers 948 & 952) are selectively etched and/or removed. In some implementations, the metal layers 948 & 952 are seed layers. In some implementations, selectively etching the seed layer (e.g., layers 948 & 952) provides several surface interconnects (e.g., first surface interconnect 977, second surface interconnect 978) on the substrate (e.g., substrate 900).

In some implementations, the carrier substrate 900 is separated (at stage 21) into two or more parts. For example, in some implementations, the carrier substrate 900 is separated into three parts, a first substrate 960, a second substrate 962, and a third substrate 964. The third substrate 964 includes a carrier core 901, and the first and second carrier layers 902-904.

The first substrate 960 includes the dielectric layers 934, 944 and 950. The first substrate 960 also includes several vias (e.g., via 937), several via pads (e.g., pad 940), and interconnect 978 (e.g., trace, pad). The second substrate 962 includes the dielectric layers 930, 942 and 946. The second substrate 962 also includes several vias (e.g., via 939), several via pads (e.g., pad 938), and interconnect 977 (e.g., trace, pad). In some implementations, the first and/or second substrate 960 & 962 may be used to provide a substrate that includes embedded interconnects (e.g., embedded trace) and/or surface interconnects (e.g., surface traces). In some implementations, the first and/or second substrate 960 & 962 may be used to provide a substrate that includes an embedded bridge structure. It should be noted that although the interconnects (e.g., interconnects 938, 940, 977, 978) are shown as having one metal layer, in some implementations, these interconnects may includes more than one metal layer. For example, these interconnects may includes a seed layer as well as another metal layer.

Stage 22 illustrates after a substrate is separated from a carrier substrate. As shown at stage 22, the substrate 960 is separated from the substrate 964. In some implementations, the process of providing a substrate may end at stage 22. In some implementations, the process of providing a substrate may further continue to stage 23.

Figure 9J:
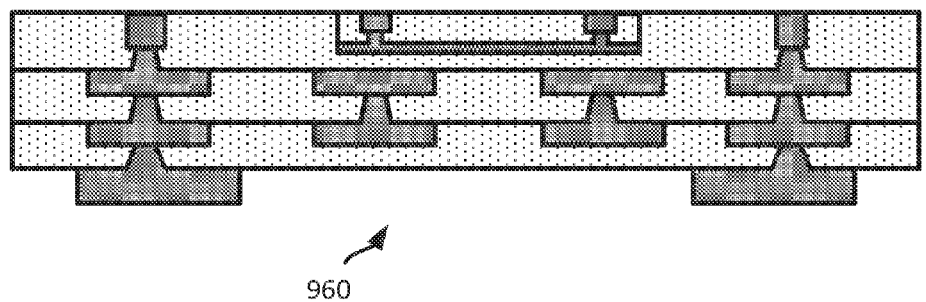
FIG. 9J illustrates part of a sequence for providing a substrate that includes an embedded bridge structure.
Figure 9J:
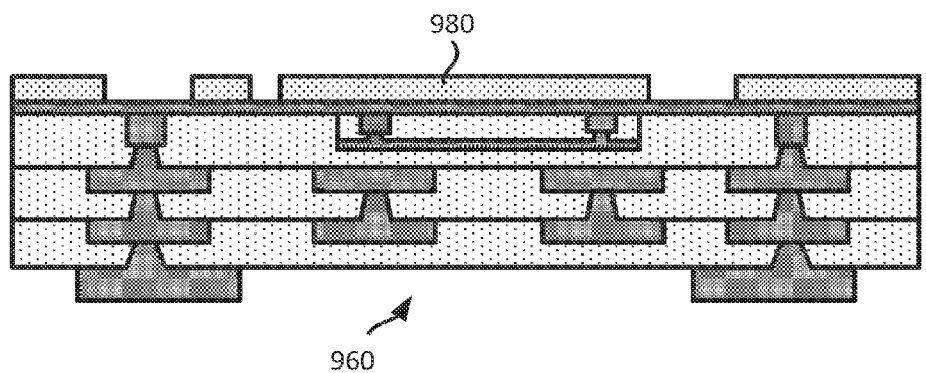
Figure 9J:
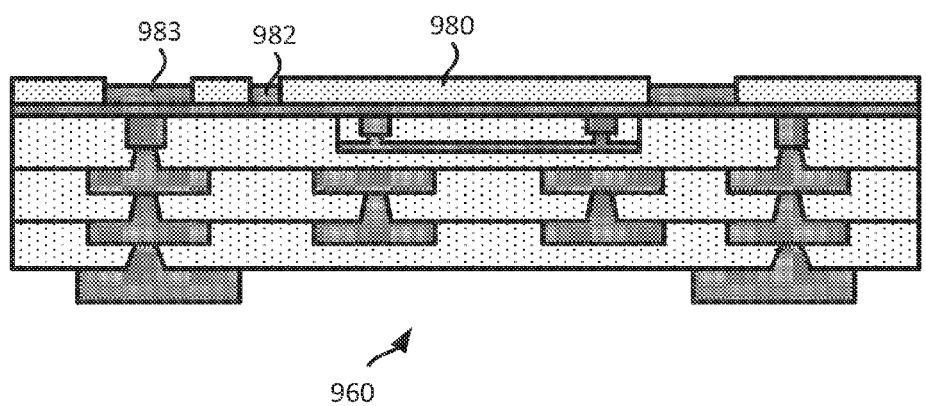

Stage 23 of FIG. 9J illustrates a substrate (e.g. first substrate 960, second substrate 962) after a first photo resist layer 980 has been applied (e.g., provided) on the substrate and selectively etched. In some implementations, etching the first photo resist layer 980 includes exposing the photo resist layer 980 and developing the first photo resist layer 980. However, different implementations, may selectively etch the photo resist layer 980. In some implementations, selectively etching the first photo resist layer 980 may create one or more cavities (e.g., cavity 981, cavity 982) in the first photo resist layer 980.

At stage 24, a patterning process is provided on the substrate (e.g., substrate 960). In some implementations, patterning includes providing a metal layer in the cavities (e.g., cavity 981, cavity 982), which may define one or more interconnects (e.g., traces), vias and/or via pads. In some implementations, the patterning process may include a patterning plating process. In some implementations, the metal layer may be a copper metal layer. For example, in some implementations, filling the cavity 981 with a metal layer (e.g., copper layer) provides an interconnect 983 (e.g., trace), and filing the cavity 982 with a metal layer (e.g., copper layer) provides an interconnect 984 (e.g., trace, pad).

Figure 9K:
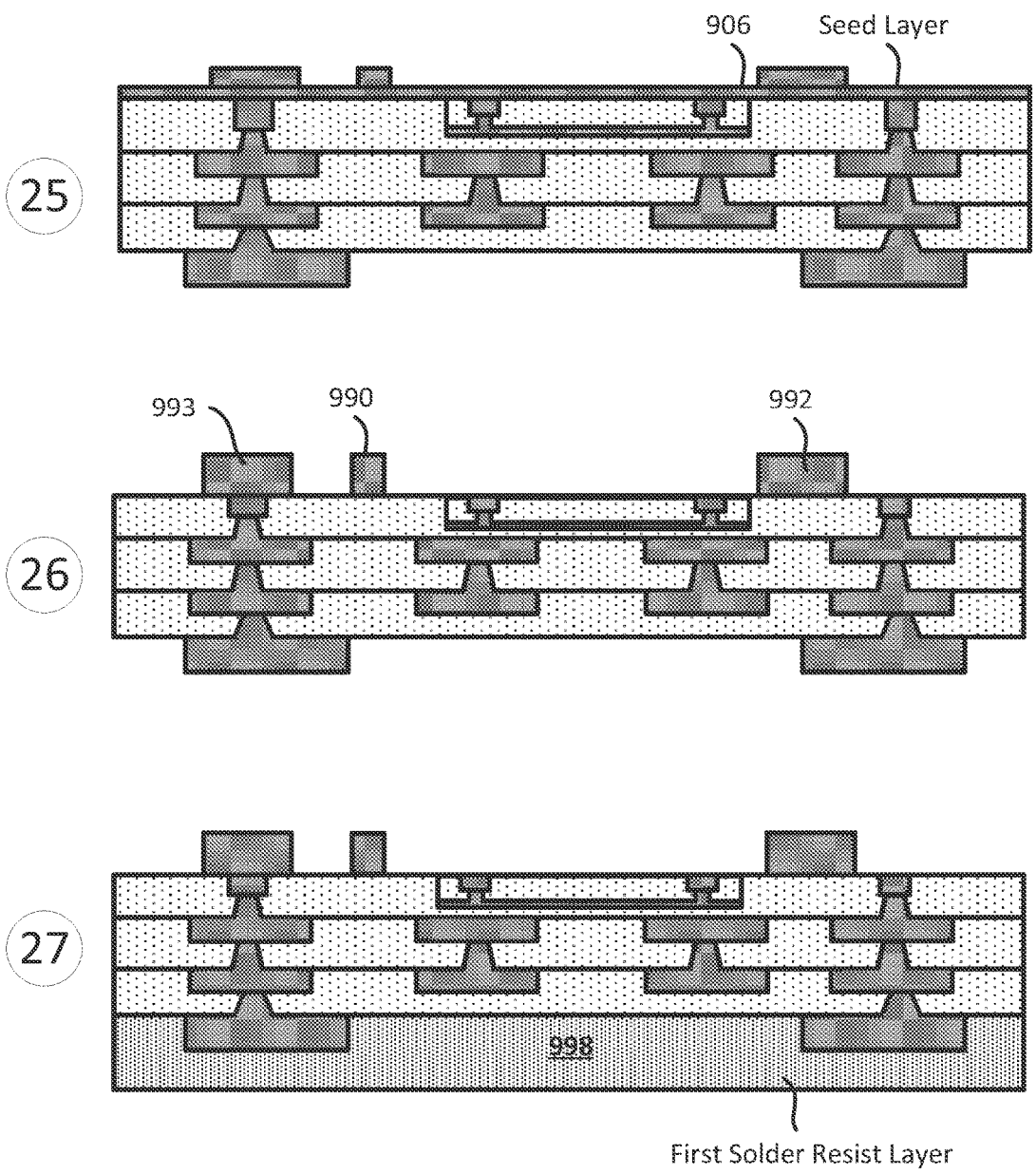
FIG. 9K illustrates part of a sequence for providing a substrate that includes an embedded bridge structure.

As shown in FIG. 9K, the first photo resist layers 980 are removed (at stage 25). Different implementations may remove the photo resist layer 980 differently.

At stage 26, the seed layer (e.g., seed layer 906) is selectively etched and/or removed. In some implementations, selectively etching the seed layer (e.g., seed layer 906) provides several surface interconnects (e.g., first surface interconnect 990, second surface interconnect 992, and third surface interconnect 993 on the substrate (e.g., substrate 960). Stage 26 also illustrates that in some implementations, selectively etching the seed layer (e.g., seed layer 906) may expose part or all of the bridge structure in the substrate. As shown at stage 26, the substrate may include one or more dielectric layers. Different implementations may provide a different number of dielectric layers in the substrate.

As further shown in FIG. 9K, a solder resist layer 998 is provided (at stage 27) on the substrate. In some implementations, the solder resist layer 998 is provided on a first surface (e.g., bottom surface) of the substrate. The solder resist layer 998 may cover the entire second surface of the substrate or only a portion of the second surface of the substrate. In some implementations, the solder resist layer 998 may cover some portions or all of the interconnects (e.g., surface interconnects, embedded interconnects) and/or pads. In some implementations, a second solder resist layer (not shown) may be provided on a second surface (e.g., top surface) of the substrate. The second solder resist layer may cover a portion of the second surface.

Figure 10:
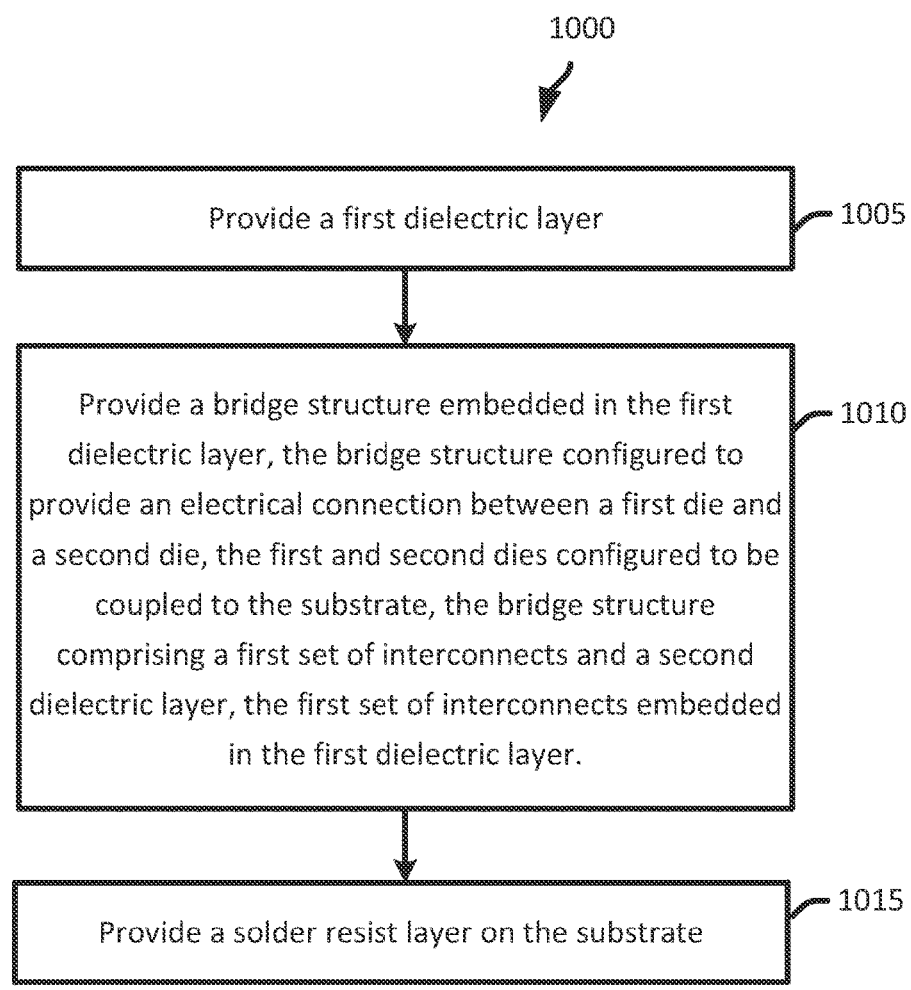
FIG. 10 illustrates an exemplary flow diagram of a method for providing a substrate that includes an embedded bridge structure.

Exemplary Flow Diagram of a Method for Providing/Manufacturing a Substrate that Includes an Embedded Bridge Structure FIG. 10 illustrates an exemplary flow diagram of a high level method for providing/manufacturing a substrate (e.g., package substrate) that includes an embedded bridge structure. It should be noted that for the purpose of clarity and simplification, the flow diagram of FIG. 10 does not necessarily include all the steps of providing/manufacturing a substrate that includes one or more embedded bridge structure. Moreover, in some instances, several steps may have been combined into a single step in order to simplify the description of the sequences.

As shown in FIG. 10, the method provides (at step 1005) a first dielectric layer. Different implementations may provide the dielectric layer differently. FIG. 9D illustrates an example of providing a dielectric layer. For example, stage 11 of FIG. 9D illustrates a dielectric layer (e.g., dielectric layers 930 and 934) being provided.

The method then provides (at step 1010) provides a bridge structure embedded in the first dielectric layer. The bridge structure is configured to provide an electrical connection between a first die and a second die. The first and second dies are configured to be coupled to the substrate. The bridge structure includes a first set of interconnects and a second dielectric layer. The first set of interconnects embedded in the first dielectric layer. Stages 6-10 of FIGS. 9B-9D illustrate an example of providing a bridge structure in some implementations. However, different implementations may use difference sequences and/or processes to provide a bridge structure embedded in a substrate.

The method also provides (at step 1015) a solder resist layer on the substrate. In some implementations, providing the solder resist layer includes providing a solder resist layer on the first surface and/or second surface of the dielectric layer. In some implementations, when the solder resist layer is provided (at 1015), the solder resist layer may cover some or all of the first surface of the dielectric layer. In some implementations, the solder resist layer may cover some portions or all of the interconnects and/or pads.

Figure 11:
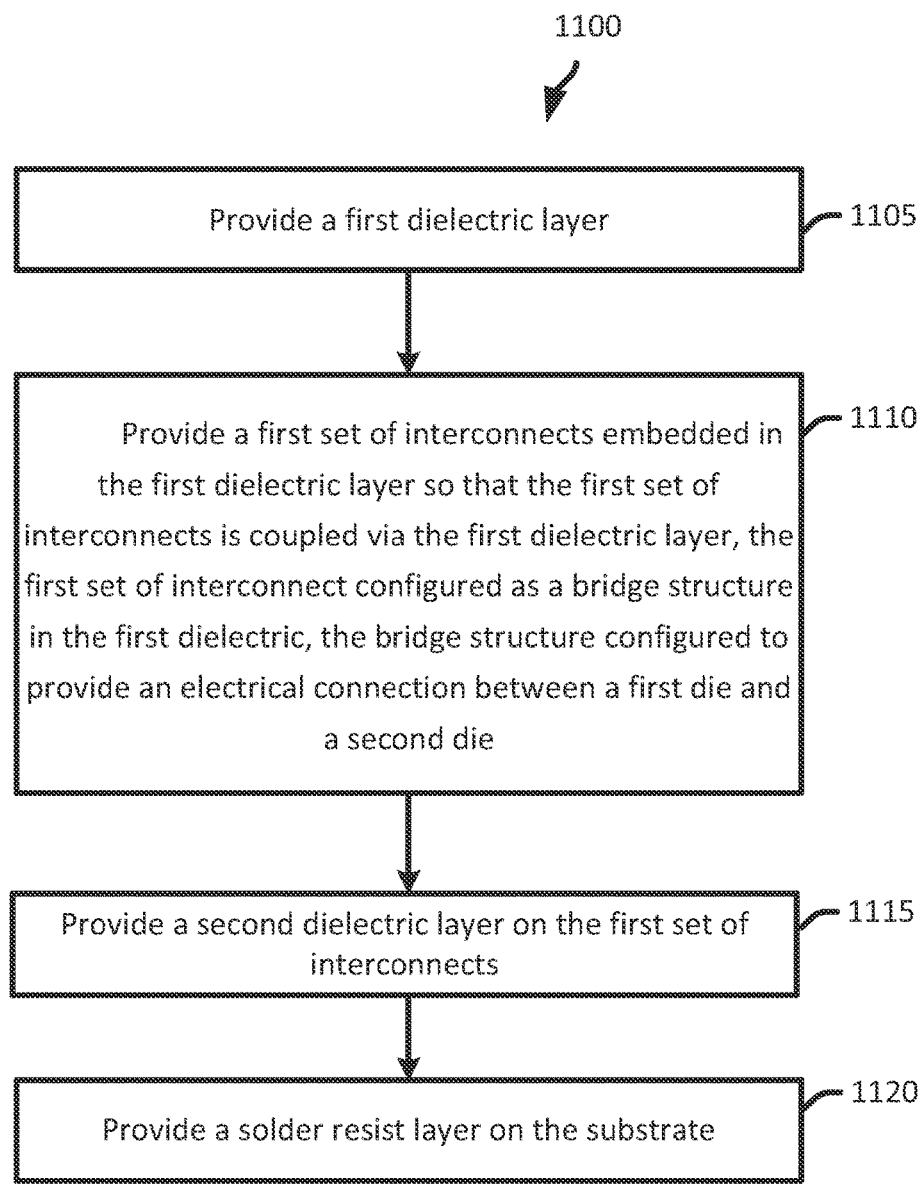
FIG. 11 illustrates an exemplary flow diagram of a method for providing a substrate that includes an embedded bridge structure.

Exemplary Flow Diagram of a Method for Providing/Manufacturing a Substrate that Includes an Embedded Bridge Structure FIG. 11 illustrates another exemplary flow diagram of a high level method for providing/manufacturing a substrate (e.g., package substrate) that includes an embedded bridge structure. It should be noted that for the purpose of clarity and simplification, the flow diagram of FIG. 11 does not necessarily include all the steps of providing/manufacturing a substrate that includes one or more embedded bridge structure. Moreover, in some instances, several steps may have been combined into a single step in order to simplify the description of the sequences.

As shown in FIG. 11, the method provides (at step 1105) a first dielectric layer. Different implementations may provide the dielectric layer differently. FIG. 9D illustrates an example of providing a dielectric layer. For example, stage 11 of FIG. 9D illustrates a dielectric layer (e.g., dielectric layers 930 and 934) being provided.

The method then provides (at step 1110) provides a first set of interconnects embedded in the first dielectric layer so that the first set of interconnects is coupled via the first dielectric layer. The first set of interconnect is configured as a bridge structure in the first dielectric. The bridge structure is configured to provide an electrical connection between a first die and a second die.

The method then provides (at step 1115) a second dielectric layer on the first set of interconnects. Stages 6-11 of FIGS. 9B-9D illustrate an example of providing a bridge structure in some implementations. Specifically, stages 6-11 of FIGS. 9B-9D illustrates an example of providing a first set of interconnects and a second dielectric layer in a substrate. However, different implementations may use difference sequences and/or processes to provide a bridge structure embedded in a substrate (e.g., dielectric layer).

The method also provides (at step 1120) a solder resist layer on the substrate. In some implementations, providing the solder resist layer includes providing a solder resist layer on the first surface and/or second surface of the dielectric layer. In some implementations, when the solder resist layer is provided (at 1120), the solder resist layer may cover some or all of the first surface of the dielectric layer. In some implementations, the solder resist layer may cover some portions or all of the interconnects and/or pads.

Exemplary Electronic Devices

Figure 12:
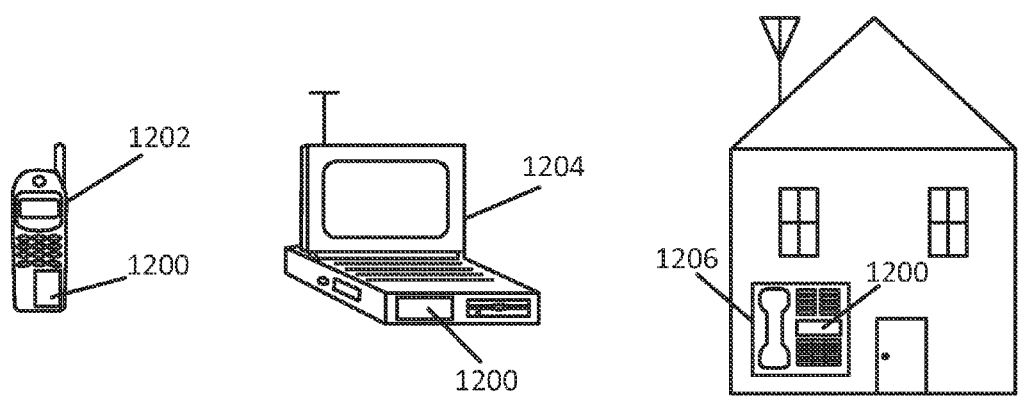
FIG. 12 illustrates various electronic devices that may integrate a substrate, an integrated circuit and/or PCB described herein.

FIG. 12 illustrates various electronic devices that may be integrated with any of the aforementioned substrate, semiconductor device, integrated circuit, die, interposer or package. For example, a mobile telephone 1202, a laptop computer 1204, and a fixed location terminal 1206 may include an integrated circuit (IC) 1200 as described herein. The IC 1200 may be, for example, any of the integrated circuits, dice or packages described herein. The devices 1202, 1204, 1206 illustrated in FIG. 12 are merely exemplary. Other electronic devices may also feature the IC 1200 including, but not limited to, mobile devices, hand-held personal communication systems (PCS) units, portable data units such as personal digital assistants, GPS enabled devices, navigation devices, set top boxes, music players, video players, entertainment units, fixed location data units such as meter reading equipment, communications devices, smartphones, tablet computers or any other device that stores or retrieves data or computer instructions, or any combination thereof.

One or more of the components, steps, features, and/or functions illustrated in FIGS. 4, 5A-5C, 6, 7A-7C, 8, 9A-9K, 10, 11 and/or 12 may be rearranged and/or combined into a single component, step, feature or function or embodied in several components, steps, or functions. Additional elements, components, steps, and/or functions may also be added without departing from the invention.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other.

Also, it is noted that the embodiments may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the invention described herein can be implemented in different systems without departing from the invention. It should be noted that the foregoing aspects of the disclosure are merely examples and are not to be construed as limiting the invention. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. A substrate comprising:
   a first surface and a second surface, wherein the first surface is located on an opposite side to the second surface;
   a first dielectric layer adjacent to the second surface;
   a bridge structure embedded in the first dielectric layer, the bridge structure configured to provide an electrical connection between a first die and a second die, the first and second dies configured to be coupled to the substrate, the bridge structure comprising a first set of interconnects and a second dielectric layer, the first set of interconnects embedded in the first dielectric layer; and
   a first solder resist layer, wherein the first solder resist layer covers a portion of the first surface of the substrate, and wherein the first solder resist layer comprises a first interconnect configured to couple to the first die and a second interconnect configured to couple to the second die.

2. The substrate of claim 1, wherein the bridge structure further includes a second set of interconnects.

3. The substrate of claim 1, wherein the second dielectric layer is embedded in the first dielectric layer.

4. The substrate of claim 1, wherein the first dielectric layer includes the first set of interconnects of the bridge structure, a second set of interconnects in the bridge structure, and a set of pads in the bridge structure.

5. The substrate of claim 1, wherein the bridge structure further includes a set of pads.

6. The substrate of claim 5, wherein the set of pads is configured to couple to a first set of bumps and interconnects for the first die, the set of pads is also configured to couple to a second set of bumps and interconnects for the second die.

7. The substrate of claim 1, wherein the substrate is a packaging substrate configured to be coupled to a printed circuit board (PCB).

8. The substrate of claim 1, wherein the substrate is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

9. The substrate of claim 1, wherein the first surface is a bottom surface of the substrate.

10. The substrate of claim 9, further comprising a second solder resist layer, wherein the second solder resist layer covers a portion of a top surface of the substrate.

11. An apparatus comprising
   a substrate, wherein the substrate comprises a first surface and a second surface, wherein the first surface is located on an opposite side to the second surface;
   a first dielectric layer adjacent to the second surface;
   a bridge means embedded in the first dielectric layer, the bridge means configured to provide an electrical connection between a first die and a second die, the first and second dies configured to be coupled to the substrate, the bridge means comprising a first set of interconnects and a second dielectric layer, the first set of interconnects embedded in the first dielectric layer; and
   a first solder resist layer, wherein the first solder resist layer covers a portion of the first surface of the substrate, and wherein the first solder resist layer comprises a first interconnect configured to couple to the first die and a second interconnect configured to couple to the second die.

12. The apparatus of claim 11, wherein the bridge means further includes a second set of interconnects.

13. The apparatus of claim 11, wherein the second dielectric layer is embedded in the first dielectric layer.

14. The apparatus of claim 11, wherein the first dielectric layer includes the first set of interconnects of the bridge means, a second set of interconnects in the bridge structure, and a set of pads in the bridge means.

15. The apparatus of claim 11, wherein the bridge means further includes a set of pads.

16. The apparatus of claim 15, wherein the set of pads is configured to couple to a first set of bumps and interconnects for the first die, the set of pads is also configured to couple to a second set of bumps and interconnects for the second die.

17. The apparatus of claim 11, wherein the substrate is a packaging substrate configured to be coupled to a printed circuit board (PCB).

18. The apparatus of claim 11, wherein the apparatus is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

19. The apparatus of claim 11, wherein the first surface is a bottom surface of the substrate.

20. The apparatus of claim 19, further comprising a second solder resist layer, wherein the second solder resist layer covers a portion of a top surface of the substrate.

21. A method for providing a substrate, comprising:
providing a first surface and a second surface, wherein the first surface is located on an opposite side to the second surface;
providing a first dielectric layer, wherein the first dielectric is located adjacent to the second surface;
providing a first set of interconnects embedded in the first dielectric layer so that the first set of interconnects is coupled via the first dielectric layer, the first set of interconnect configured as a bridge structure in the first dielectric, the bridge structure configured to provide an electrical connection between a first die and a second die;
providing a second dielectric layer on the first set of interconnects;
providing a first solder resist layer to cover a portion of the first surface of the substrate;
providing a first interconnect embedded within the first solder resist layer, wherein the first interconnect is configured to couple to the first die; and
providing a second interconnect embedded within the first solder resist layer, wherein the second interconnect is configured to couple to the second die.

22. The method of claim 21, further comprising providing a second set of interconnects in the first dielectric layer.

23. The method of claim 21, wherein the second dielectric layer is embedded in the first dielectric layer.

24. The method of claim 21, wherein the first dielectric layer includes the first set of interconnects of the bridge structure, a second set of interconnects in the bridge structure, and a set of pads in the bridge structure.

25. The method of claim 21, further comprising a set of pads coupled to the first set of interconnects.

26. The method of claim 25, wherein the set of pads is configured to couple to a first set of bumps and interconnects for the first die, the set of pads is also configured to couple to a second set of bumps and interconnects for the second die.

27. The method of claim 21, wherein the substrate is a packaging substrate configured to be coupled to a printed circuit board (PCB).

28. The method of claim 21, wherein the substrate is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

29. The method of claim 21, wherein the first surface is a bottom surface of the substrate.

30. The method of claim 29, further comprising providing a second solder resist layer to cover a portion of a top surface of the substrate.

* * * * *